(12) United States Patent
Komposch et al.

(10) Patent No.: US 12,470,185 B2
(45) Date of Patent: Nov. 11, 2025

(54) SEMICONDUCTOR DEVICE PACKAGES WITH EXPOSED HEAT DISSIPATING SURFACES AND METHODS OF FABRICATING THE SAME

(71) Applicant: Wolfspeed, Inc., Durham, NC (US)

(72) Inventors: Alexander Komposch, Morgan Hill, CA (US); Eng Wah Woo, Ipoh (MY); Soon Lee Liew, Ipoh (MY); Kok Meng Kam, Ipoh (MY)

(73) Assignee: Wolfspeed, Inc., Durham, NC (US)

( * ) Notice: Subject to any disclaimer, the term of this patent is extended or adjusted under 35 U.S.C. 154(b) by 573 days.

(21) Appl. No.: 17/849,206

(22) Filed: Jun. 24, 2022

(65) Prior Publication Data
US 2023/0421119 A1 Dec. 28, 2023

(51) Int. Cl.
*H03F 3/24* (2006.01)
*H01L 23/36* (2006.01)
*H01L 23/66* (2006.01)
*H03F 1/52* (2006.01)
*H03F 3/195* (2006.01)

(52) U.S. Cl.
CPC ............ *H03F 3/245* (2013.01); *H01L 23/36* (2013.01); *H01L 23/66* (2013.01); *H03F 1/523* (2013.01); *H03F 3/195* (2013.01); *H01L 2223/6611* (2013.01); *H01L 2223/6655* (2013.01); *H03F 2200/447* (2013.01); *H03F 2200/451* (2013.01)

(58) Field of Classification Search
CPC .......... H03F 3/245; H03F 1/523; H03F 3/195; H03F 2200/447; H03F 2200/451; H01L 23/36; H01L 23/66; H01L 2223/6611; H01L 2223/6655; H01L 21/566; H01L 23/3675; H01L 23/49822; H01L 24/16; H01L 24/81; H01L 23/3121; H01L 23/3677; H01L 23/4334; H01L 23/055
USPC .................................................. 330/307, 289
See application file for complete search history.

(56) References Cited

U.S. PATENT DOCUMENTS

| | | | |
|---|---|---|---|
| 11,990,872 B2* | 5/2024 | Tucker | ................ H01L 23/3675 |
| 2005/0230797 A1 | 10/2005 | Ho et al. | |
| 2007/0290310 A1 | 12/2007 | Kusano et al. | |
| 2014/0264799 A1 | 9/2014 | Gowda et al. | |

(Continued)

FOREIGN PATENT DOCUMENTS

| | | |
|---|---|---|
| EP | 3907756 A1 | 11/2021 |
| WO | 2022078725 A1 | 4/2022 |

OTHER PUBLICATIONS

Notification of Transmittal of the International Search Report and the Written Opinion of the International Searching Authority, or the Declaration, in corresponding PCT Application No. PCT/US2023/025505 (Sep. 14, 2023).

(Continued)

*Primary Examiner* — Hieu P Nguyen
(74) *Attorney, Agent, or Firm* — Myers Bigel, P.A.

(57) ABSTRACT

A semiconductor device package includes an interconnect structure with a first surface having at least one die thereon and a second surface that is opposite the first surface and is configured to be coupled to an external device. A protective structure on the first surface of the interconnect structure exposes a heat dissipating surface facing away from the interconnect structure in one or more directions. Related devices and fabrication methods are also discussed.

31 Claims, 17 Drawing Sheets

(56) References Cited

U.S. PATENT DOCUMENTS

| | | |
|---|---|---|
| 2018/0040537 A1 | 2/2018 | Grassmann et al. |
| 2021/0028122 A1 | 1/2021 | Son et al. |
| 2021/0118835 A1 | 4/2021 | Wu et al. |
| 2021/0313282 A1 | 10/2021 | Noori et al. |
| 2021/0313293 A1 | 10/2021 | Noori et al. |
| 2021/0376807 A1 | 12/2021 | Lim et al. |
| 2022/0059427 A1 | 2/2022 | Kondo et al. |
| 2022/0084950 A1 | 3/2022 | Noori et al. |

OTHER PUBLICATIONS

Communication pursuant to Article 94(3) EPC corresponding to European Application No. 23741840.5 (10 pages) (mailed Oct. 2, 2025).

* cited by examiner

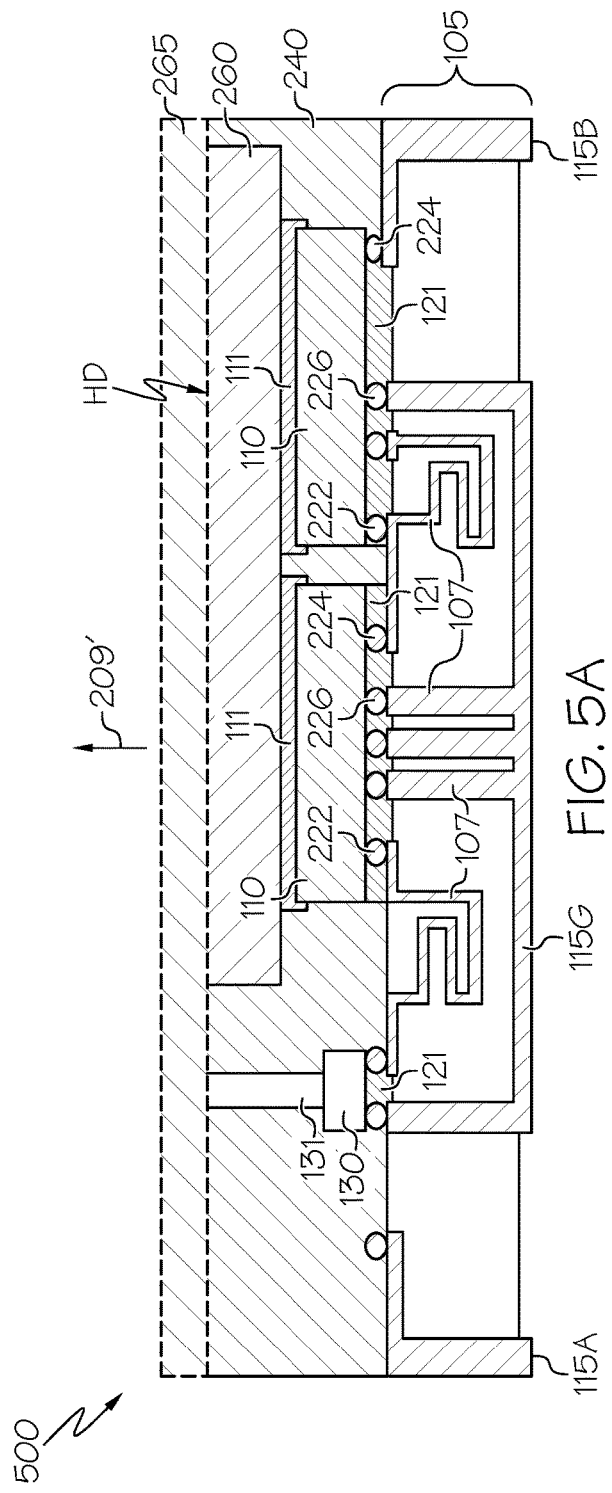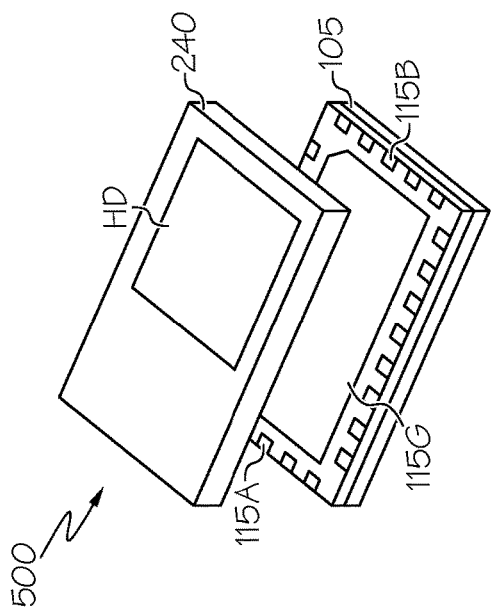

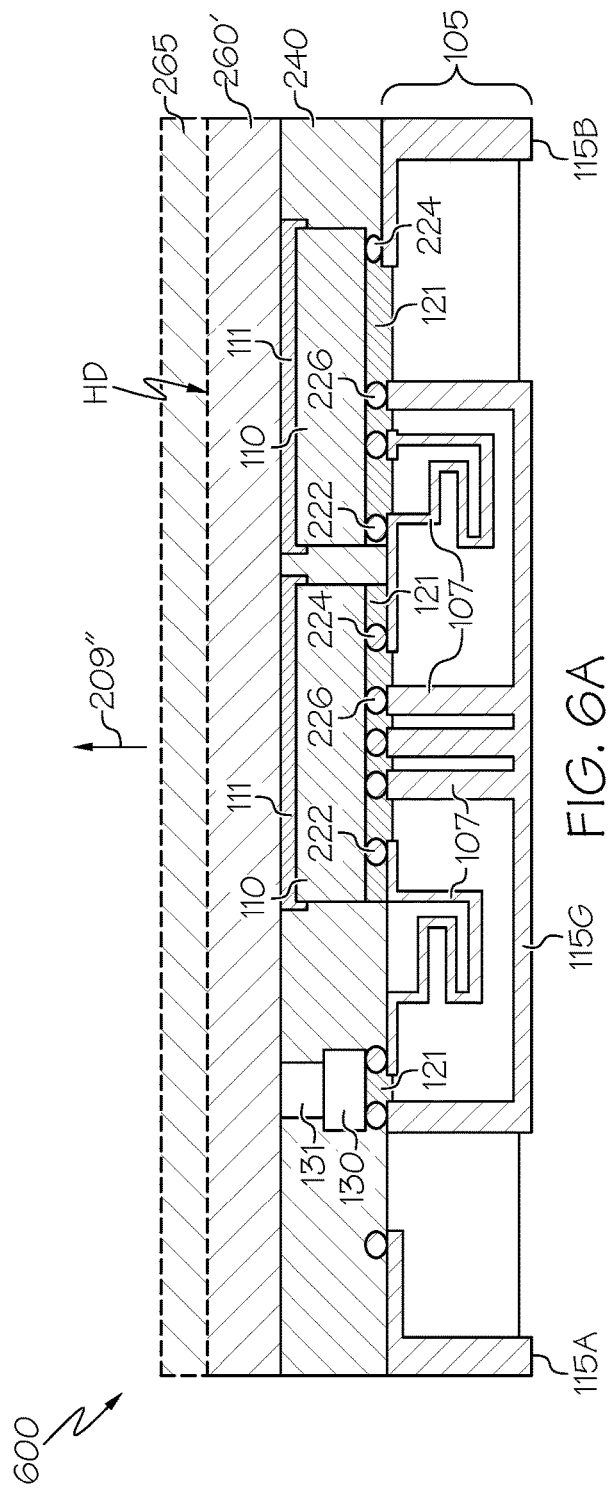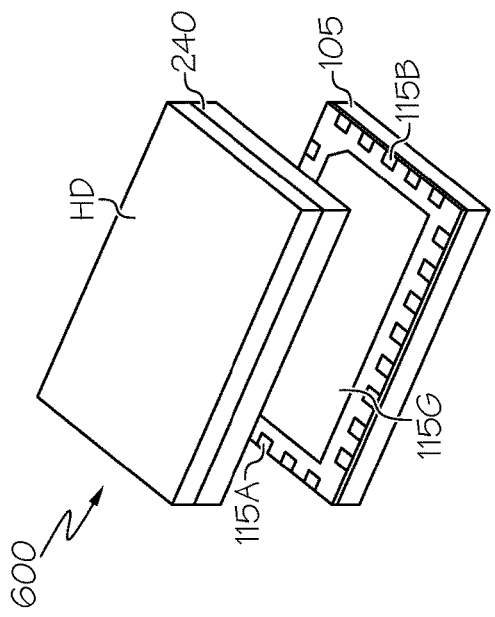

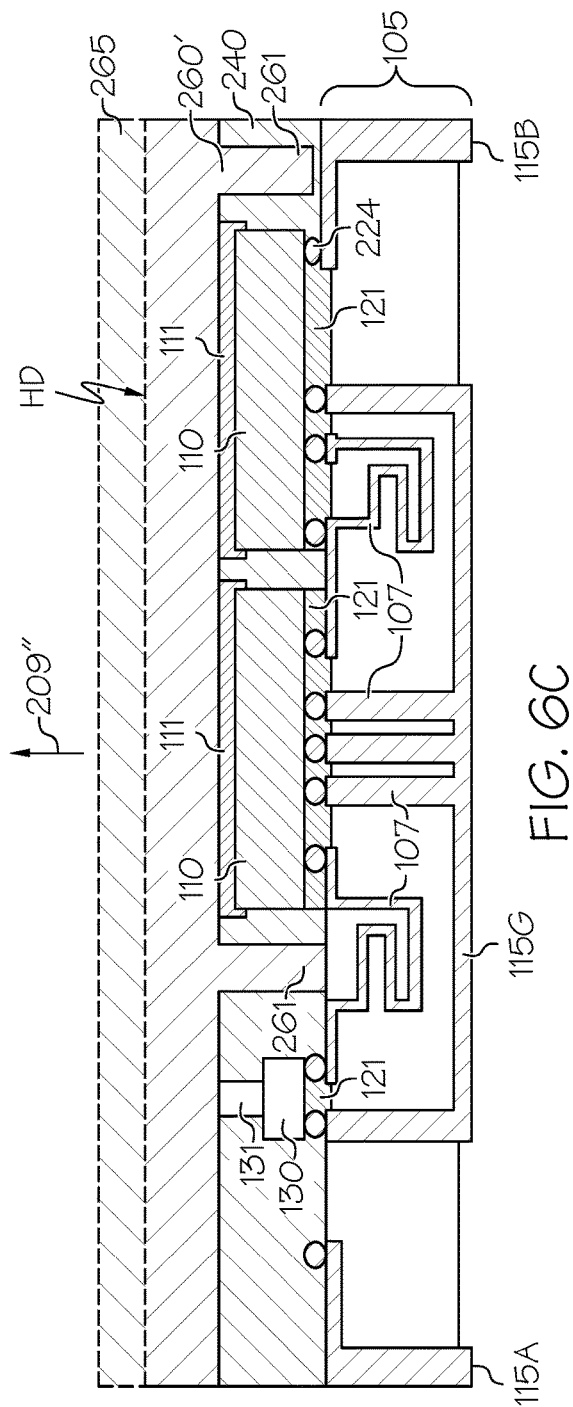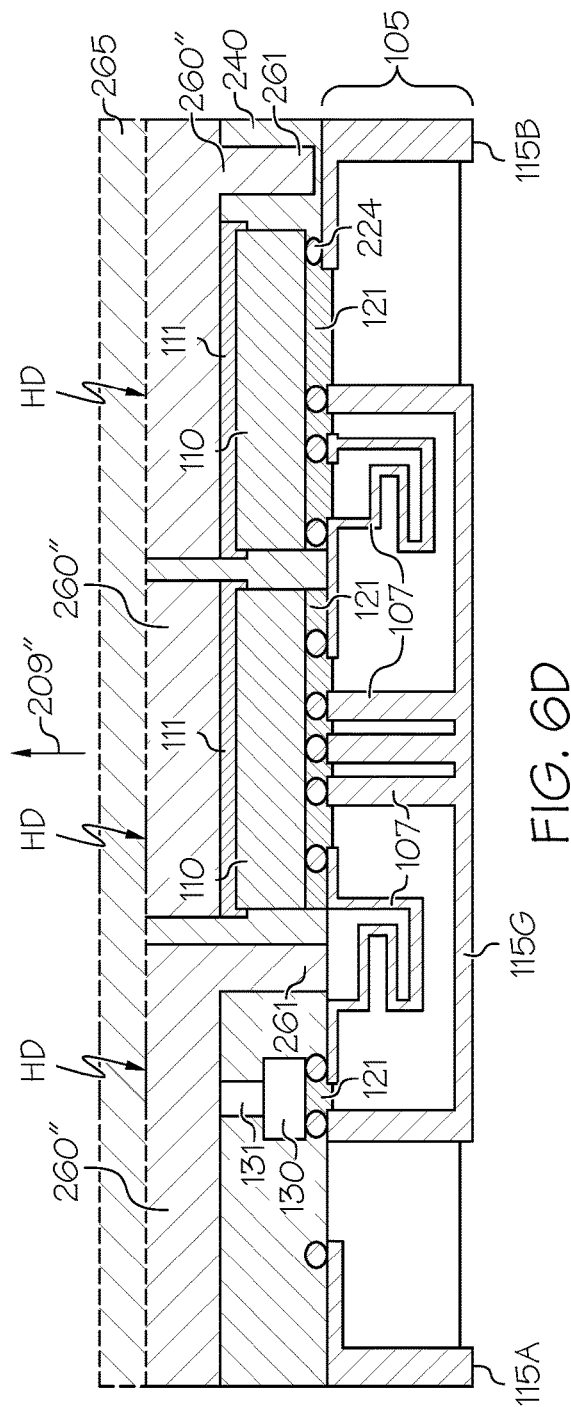

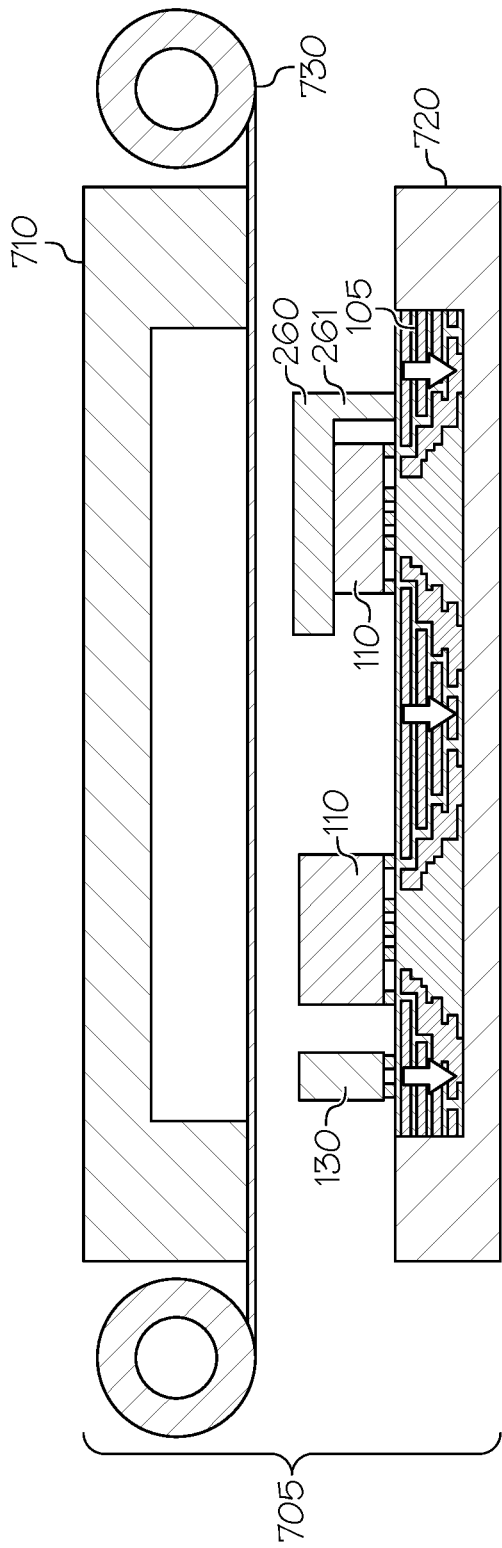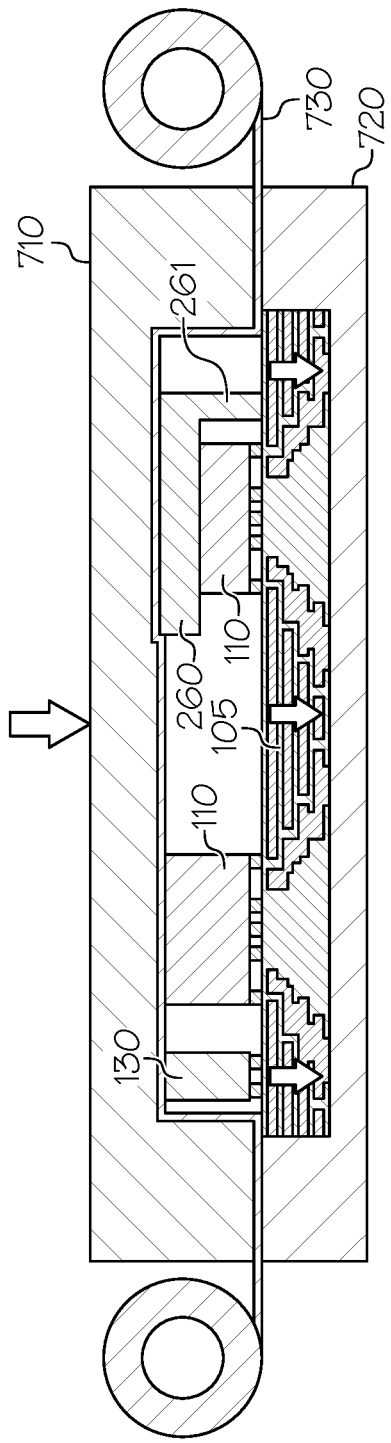
FIG. 7A
FIG. 7B

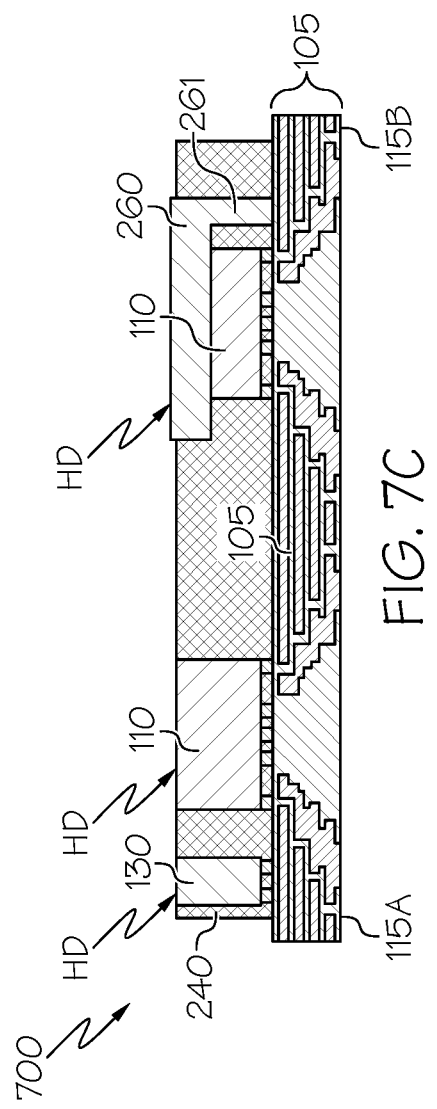

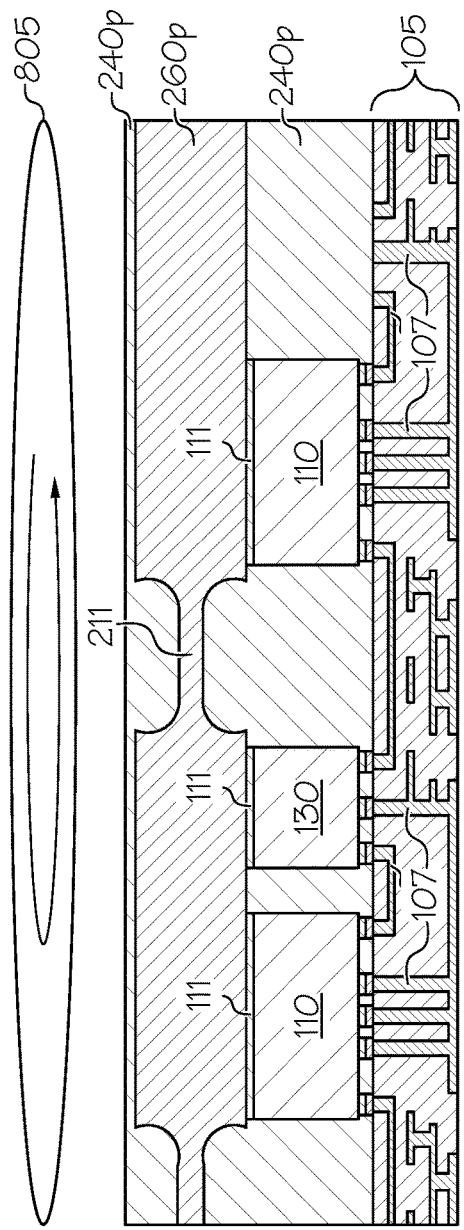
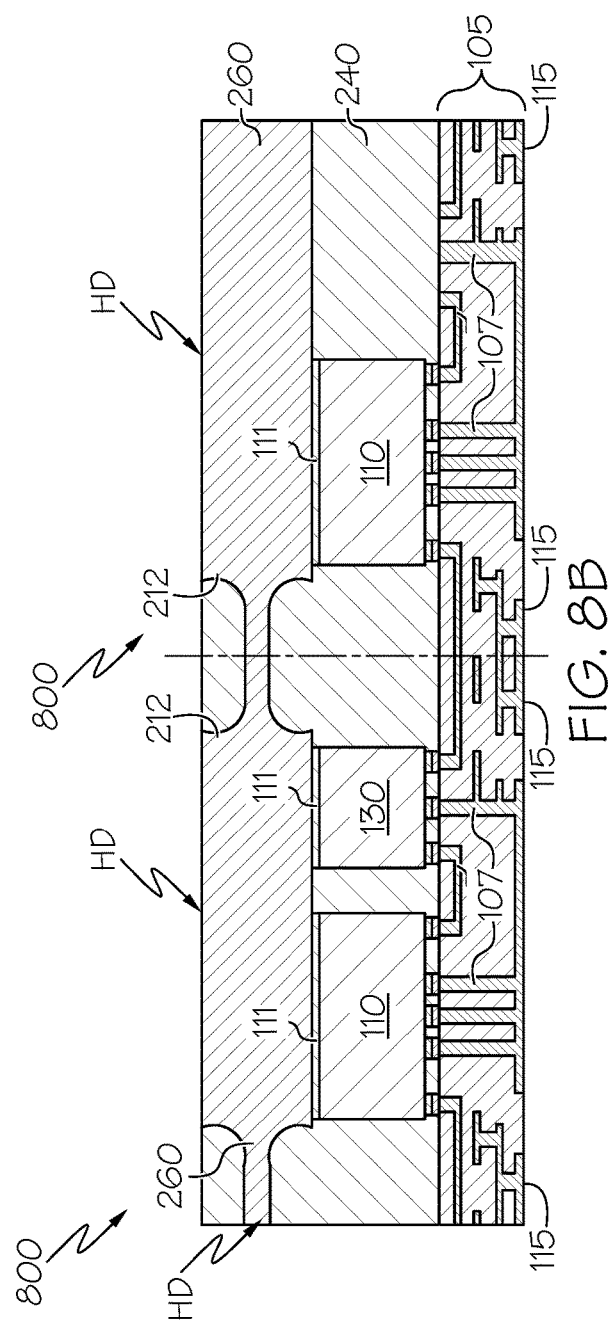

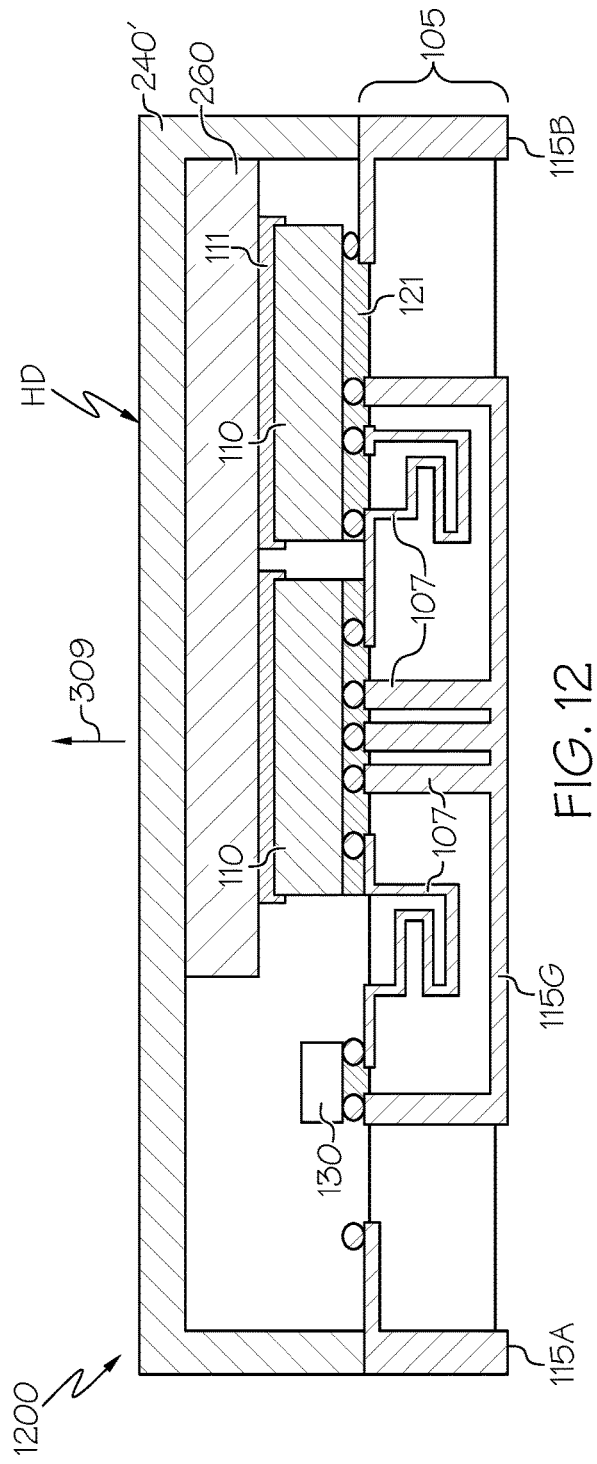
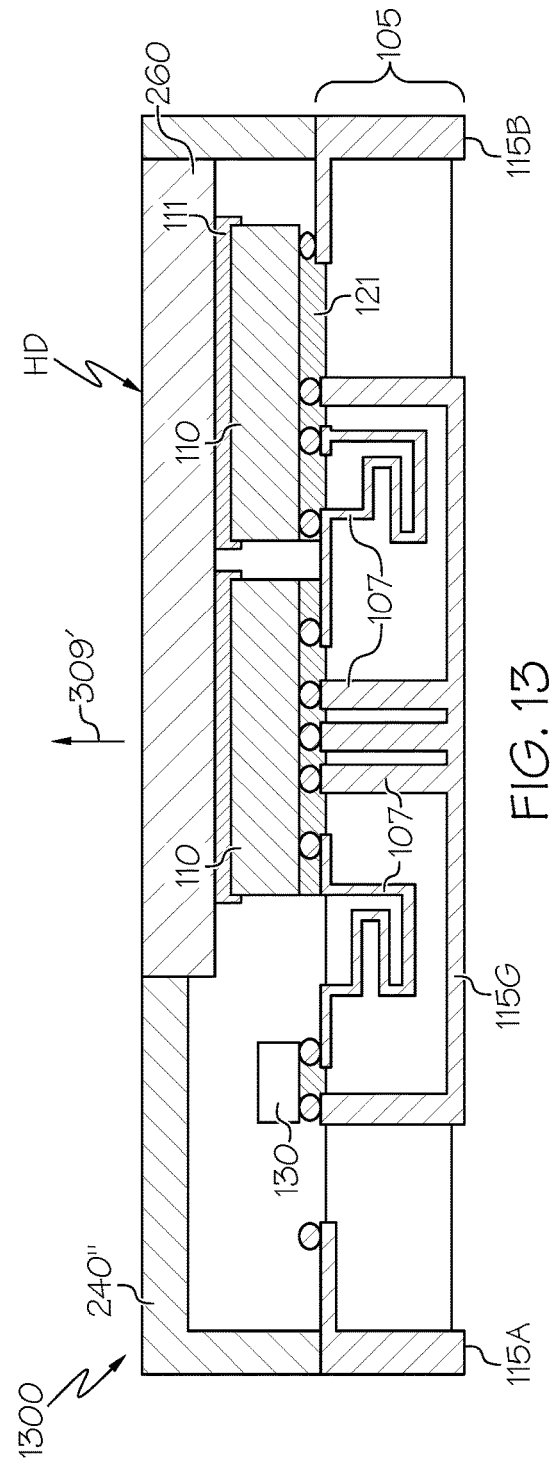

SEMICONDUCTOR DEVICE PACKAGES WITH EXPOSED HEAT DISSIPATING SURFACES AND METHODS OF FABRICATING THE SAME

FIELD

The present disclosure is directed to semiconductor devices, and more particularly, to semiconductor device packaging.

BACKGROUND

Power semiconductor devices, such as power amplifiers, are used in a variety of applications such as base stations for wireless communication systems, multi-stage and multiple-path amplifiers (e.g., Doherty amplifiers), etc. The signals amplified by power amplifiers often include signals that have a modulated carrier having frequencies in the megahertz (MHz) to gigahertz (GHz) range. For example, electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now a high demand for radio frequency ("RF") transistor amplifiers that are used to amplify RF signals at frequencies of, for example, 500 MHz and higher (including microwave frequencies).

Many power amplifier designs utilize semiconductor switching devices as amplification devices. Examples of these switching devices include power transistor devices, such as MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc. A power amplifier may also include passive matching networks at the input and output nodes of the active power transistor devices.

The transistor devices are typically formed as semiconductor integrated circuit chips. Transistor devices may be implemented, for example, in silicon or using wide bandgap semiconductor materials (i.e., having a band-gap greater than 1.40 eV), such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers may typically be implemented using LDMOS transistors, and can exhibit high levels of linearity with relatively inexpensive fabrication. Group III nitride-based RF amplifiers may typically be implemented using HEMTs, primarily in applications requiring high power and/or high frequency operation where LDMOS transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are electrically connected (e.g., in parallel). An RF transistor amplifier may be implemented as a single integrated circuit chip or "die," or may include a plurality of dies. A die or chip may include a small block of semiconducting material or other substrate in which electronic circuit elements are fabricated. For example, a plurality of individual power transistor devices may be formed on a relatively large semiconductor substrate (e.g., by growing epitaxial layers there on doping selected regions with dopants, forming insulation and metal layers thereon, etc.) and the completed structure may then be cut (e.g., by a sawing or dicing operation) into a plurality of individual die. When multiple RF transistor amplifier dies are used, they may be connected in series and/or in parallel.

RF transistor amplifiers often include matching circuits, such as impedance matching circuits, that are designed to improve the impedance match between the active transistor die (e.g., including MOSFETs, HEMTs, LDMOS, etc.) and transmission lines connected thereto for RF signals at the fundamental operating frequency, and harmonic termination circuits that are designed to at least partly terminate harmonic products that may be generated during device operation such as second and third order harmonic products. The termination of the harmonic products also influences generation of intermodulation distortion products.

The RF amplifier transistor die(s) as well as the impedance matching and harmonic termination circuits may be enclosed in a device package. Integrated circuit packaging may refer to encapsulating one or more dies in a supporting case or package (e.g., an overmold or open cavity package) that protects the dies from physical damage and/or corrosion, and supports the electrical contacts for connection to external circuits. The input and output impedance matching circuits in an integrated circuit device package typically include LC networks that provide at least a portion of an impedance matching circuit that is configured to match the impedance of the active transistor die to a fixed value. The package may include electrical leads to electrically connect the RF amplifier to external circuit elements, such as input and output RF transmission lines and bias voltage sources.

Some conventional methods for assembling RF power devices may involve assembling the transistor die and some of the matching network components in a ceramic or overmolded package on a laminate or flange. The transistor die, capacitors, and input/output leads may be interconnected with wires, such as gold and/or aluminum wires. The wirebond-based connections of some conventional semiconductor device packages may introduce or contribute to several problems. For example, as operating frequencies increase (e.g., above about 5 GHz), parasitic effects of the wirebonds may result in variability in inductance, thereby affecting design and/or effectiveness of the matching circuits. Such wirebond-based assembly processes may also be slow and sequential (e.g., one package bonded at a time), and assembly costs may be high (e.g., due to cost of gold wires and expensive wire-bond machines).

SUMMARY

According to some embodiments, a semiconductor device package includes an interconnect structure with a first surface having at least one die thereon and a second surface that is opposite the first surface and is configured to be mounted on or otherwise coupled to an external device. A protective structure is provided on the first surface of the interconnect structure. The protective structure exposes a heat dissipating surface. The heat dissipating surface may face away from the interconnect structure in one or more directions.

In some embodiments, the heat dissipating surface may be an externally facing surface of the at least one die, or a thermally conductive and/or protective member thereon.

In some embodiments, the protective structure comprises at least one opening therein that exposes the heat dissipating surface.

In some embodiments, the heat dissipating surface comprises a surface of the at least one die opposite the interconnect structure.

In some embodiments, the heat dissipating surface comprises a thermally conductive member on a surface of the at least one die opposite the interconnect structure.

In some embodiments, the thermally conductive member further comprises one or more support structures coupled to the interconnect structure.

In some embodiments, a surface of the protective structure comprises at least one opening therein that exposes the thermally conductive member.

In some embodiments, a surface of the protective structure comprises at least one opening therein that exposes the surface of the at least one die opposite the interconnect structure, and the thermally conductive member is on the surface of the protective structure.

In some embodiments, the at least one die comprises respective terminals facing the first surface of the interconnect structure and electrically connected to conductive patterns thereof in a flip chip configuration.

In some embodiments, the at least one die comprises one or more transistors having gate, source, or drain connections coupled to the respective terminals.

In some embodiments, the at least one die comprises one or more passive electrical components.

In some embodiments, the respective terminals comprise conductive bumps or conductive pillar structures.

In some embodiments, the second surface of the interconnect structure comprises input and output connections for the semiconductor device package.

In some embodiments, the protective structure comprises a mold structure.

In some embodiments, the protective structure comprises a lid member.

In some embodiments, the lid member is on the at least one die, and the heat dissipating surface comprises a surface of the lid member opposite the at least one die.

In some embodiments, the heat dissipating surface is coupled or is configured to be coupled to an external cooling device.

According to some embodiments, a semiconductor device package includes an interconnect structure comprising conductive patterns therein and/or thereon. The interconnect structure has a first surface, and a second surface that is opposite the first surface and is configured to be mounted on or otherwise coupled to an external device. At least one die is provided on the first surface of the interconnect structure. The at least one die comprises respective terminals facing the first surface and electrically connected to the conductive patterns in a flip chip configuration. A heat dissipating surface is on the at least one die. The heat dissipating surface faces away from the interconnect structure in one or more directions. For example, the heat dissipating surface may be an externally facing surface of the at least one die, or a thermally conductive and/or protective member thereon.

In some embodiments, the heat dissipating surface comprises a surface of the at least one die opposite the interconnect structure.

In some embodiments, the heat dissipating surface comprises a thermally conductive member on a surface of the at least one die opposite the interconnect structure.

In some embodiments, a protective structure is provided on on the first surface of the interconnect structure. The protective structure exposes the heat dissipating surface, for example, opposite the interconnect structure.

In some embodiments, the protective structure comprises a mold structure having at least one opening therein that exposes the heat dissipating surface.

In some embodiments, the protective structure comprises a lid member on the at least one die, and the heat dissipating surface comprises a surface of the lid member opposite the at least one die.

In some embodiments, the heat dissipating surface is coupled or is configured to be coupled to an external cooling device.

According to some embodiments, a method of fabricating a semiconductor device package includes providing an interconnect structure comprising a first surface having at least one die thereon, and a second surface that is opposite the first surface and is configured to be mounted on or otherwise coupled to an external device. Respective terminals of the at least one die are electrically connected to conductive patterns of the interconnect structure. A protective structure is formed on the first surface of the interconnect structure to provide a heat dissipating surface that is exposed thereby.

In some embodiments, forming the protective structure comprises forming the protective structure with at least one opening therein that exposes the heat dissipating surface.

In some embodiments, the protective structure comprises a mold structure.

In some embodiments, forming the protective structure comprises a film assisted molding process wherein a film covers the heat dissipating surface during formation of the mold structure.

In some embodiments, forming the protective structure comprises a laser ablation process that removes portions of the mold structure from the heat dissipating surface.

In some embodiments, forming the protective structure comprises a mechanical grinding process that removes portions of the mold structure from the heat dissipating surface.

In some embodiments, the heat dissipating surface comprises a surface of the at least one die, for example, opposite the interconnect structure.

In some embodiments, the heat dissipating surface comprises a thermally conductive member on a surface of the at least one die, for example, opposite the interconnect structure.

In some embodiments, the thermally conductive member is attached to the surface of the at least one die before forming the protective structure.

In some embodiments, the thermally conductive member is attached to the surface of the at least one die after forming the protective structure.

In some embodiments, the protective structure comprises a lid member on the at least one die, and the heat dissipating surface comprises a surface of the lid member opposite the at least one die.

In some embodiments, the second surface is mounted on the external device, and/or an external cooling device is provided on the heat dissipating surface.

In some embodiments, the at least one die is a Group III nitride-based material.

In some embodiments, an operating frequency of the RF transistor amplifier is in the R-band, S-band, X-band, Ku-band, K-band, Ka-band, and/or V-band.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 5A is a schematic cross-sectional view of a semiconductor device package including a thermally conductive member as an exposed heat dissipating surface in accordance with some embodiments of the present disclosure.

FIG. 5B shows top and bottom perspective views of the semiconductor device package of FIG. 5A.

FIG. 6A is a schematic cross-sectional view of a semiconductor device package including a thermally conductive member as an exposed heat dissipating surface in accordance with further embodiments of the present disclosure.

FIG. 6B shows top and bottom perspective views of the semiconductor device package of FIG. 6A.

FIG. 6C is a schematic cross-sectional view of a semiconductor device package including a thermally conductive member as an exposed heat dissipating surface with multiple integrated clips or support structures in accordance with some embodiments of the present disclosure.

FIG. 6D is a schematic cross-sectional view of a semiconductor device package including multiple thermally conductive members as exposed heat dissipating surfaces in accordance with some embodiments of the present disclosure.

FIGS. 7A, 7B, and 7C are schematic cross-sectional views illustrating methods of fabricating semiconductor device packages using a film assisted molding process to expose heat dissipating surfaces in accordance with some embodiments of the present disclosure.

FIGS. 8A and 8B are schematic cross-sectional views illustrating methods of fabricating semiconductor device packages using a back grinding process to expose heat dissipating surfaces in accordance with some embodiments of the present disclosure.

FIG. 12 is a schematic cross-sectional view of a semiconductor device package including a thermally conductive lid member as an exposed heat dissipating surface in accordance with some embodiments of the present disclosure.

FIG. 13 is a schematic cross-sectional view of a semiconductor device package including a thermally conductive member as a heat dissipating surface exposed by a lid member in accordance with some embodiments of the present disclosure.

DETAILED DESCRIPTION

In the following detailed description, numerous specific details are set forth to provide a thorough understanding of embodiments of the present disclosure. However, it will be understood by those skilled in the art that the present disclosure may be practiced without these specific details. In some instances, well-known methods, procedures, components, and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

Figure 1:
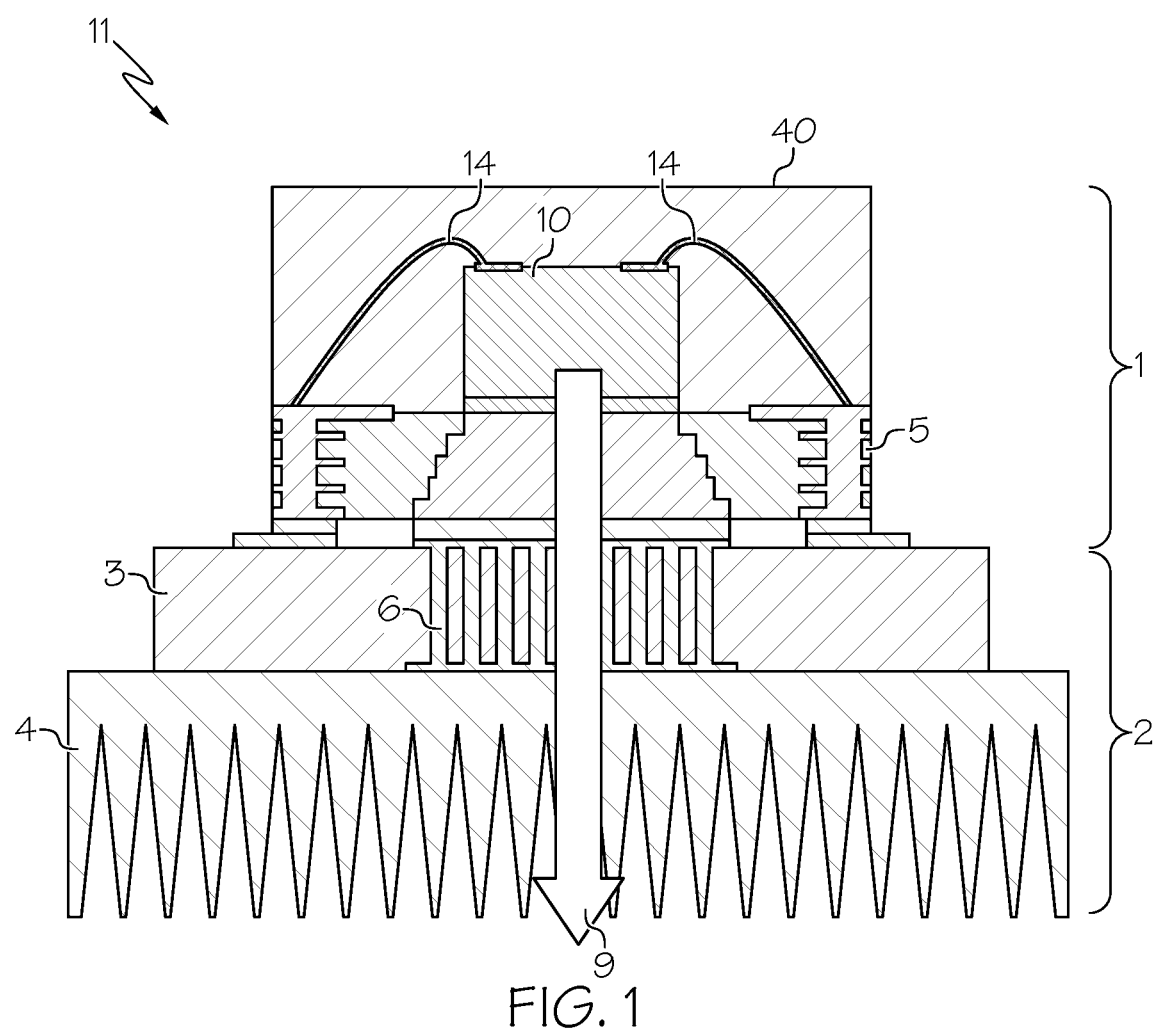
FIG. 1 is a schematic cross-sectional view of a conventional semiconductor device package mounted on an external device.

FIG. 1 is a schematic cross-sectional view of a conventional semiconductor device package 1 mounted on an external device 2, such as a customer circuit board or other application (illustrated as a printed circuit board (PCB) or motherboard 3 including a heat sink or chassis 4 opposite the package 1). In particular, FIG. 1 illustrates a heat conduction path 9 in a conventional massive multiple input multiple output (mMIMO) power amplifier 11.

As shown in FIG. 1, the semiconductor device package 1 includes a semiconductor die 10 mounted on an interconnect structure 5. The semiconductor die 10 may include a semiconductor structure (for example, a silicon-, group III nitride-, and/or silicon carbide-based structure) defining transistor unit cells therein. The interconnect structure 5 may be a PCB or laminate structure including conductive patterns therein or thereon. Wirebond connections 14 electrically connect the terminals of the die 10 (which are on a "front" or active surface of the die adjacent the conduction channels) to the conductive patterns of the interconnect structure 5, and are covered or otherwise protected by a mold structure 40. The "back" or inactive surface of the die 10 is mounted on a conductive member of the interconnect structure 5, for example, by a thermally conductive adhesive. Heat generated by the die 10 may be dissipated for cooling the power amplifier 11 through a heat conduction or heat conduction path 9. In the power amplifier 11 of FIG. 1, the heat conduction path 9 is implemented through the bottom of the package 1, to the circuit board 3 (which in the illustrated example includes a via array 6 extending therethrough), to the heatsink 4, and out of the power amplifier 11.

As noted above, wirebond-based connections of some conventional semiconductor device packages may introduce or contribute to several problems. For example, as operating frequencies increase (e.g., above 5 to 6 GHz) parasitic effects of the wirebonds may result in variability in inductance, thereby affecting design and/or effectiveness of matching networks. In addition, high levels of heat may be generated within the semiconductor die(s) during operation. If the die(s) become too hot, the performance (e.g., output power, efficiency, linearity, gain, etc.) of the amplifier may deteriorate and/or the die(s) may be damaged. Also, via arrays in the external device (which may be used for heat conduction) may impose restrictions on functionality of the external device. For example, due to the heat conduction path 9 provided by the via array 6 through the external device 2 in FIG. 1, the bottom surface of the external device 2 may not be used to implement other features (such as array antennas).

Some embodiments of the present invention may arise from realization that flip-chip configurations may help alleviate the above and other problems. As used herein, "flip chip" may refer to a configuration in which pads or terminals of a transistor die or other circuit components are electrically connected by conductive bumps or pillars, rather than by wirebonds. For example, a transistor die may have one or more gate terminals, drain terminals, and source terminals located on the same side or surface of the transistor die adjacent the active conduction channel (also referred to herein as the active surface of the die), which is opposite the inactive surface (also referred to herein as the back surface) of the die. The terminals may be implemented by conductive pillars (e.g., copper pillars) and/or conductive bumps (e.g., solder bumps). The die may be "flipped" onto an underlying interconnect structure (i.e., with the active surface of the die facing toward the interconnect structure, and the opposing inactive surface of the die facing away from the interconnect structure) such that one or more terminals on the active surface are electrically connected to the conductive patterns of the interconnect structure.

As such, bond wires may not be required for the gate and drain connections, which may reduce an amount of inductance present in the circuit and thus reduce parasitic effects relating to the package and connections. In addition, providing the terminals for electrical connections at the front surface of the die for mounting in a flip-chip configuration may allow for heat conduction paths away from the external circuit board or other device or application.

More generally, embodiments of the present invention are directed to packaging technologies for semiconductor dies (e.g., silicon (Si), silicon carbide (SiC), or gallium nitride (GaN) on SiC transistor dies and/or dies including passive electrical components) that provide a heat conduction path by exposing or otherwise providing a heat dissipating surface (e.g., an inactive surface of one or more semiconductor dies or a thermally conductive member thereon) at the "top" side of the package (i.e., opposite to the side of the package that provides an interface to be mounted on or otherwise coupled to an external device or application, also referred to as the bottom side of the package). The heat dissipating surface can be used to conduct heat (through the top of the package) into a cooling solution, such as a heat sink. In some embodiments, the bottom of the semiconductor device package can be configured or optimized for electrical performance, such as reduced or minimized impedances. In some embodiments, the die(s) may be mounted on the interconnect structure (e.g., a single- or multi-layer laminate or PCB including conductive patterns therein and/or thereon) in a flip chip configuration.

The interconnect structure including the die(s) thereon may provide a semiconductor device package, with a bottom side of the package (which may be provided by the bottom surface of the interconnect structure) being configured to be coupled to an external device, such as a PCB or other customer application. The top side of the package (which may include one or more exposed heat dissipating surfaces HD described herein) may likewise be configured to be coupled to an external device, for example, a heat sink or heat spreader or other external cooling solution in a customer application. As used herein, the term "coupled" may refer to physical mounting and/or electrical connection. As such, an element that is coupled to another element may be mechanically, thermally, and/or electrically coupled to the other element.

Figure 2A:
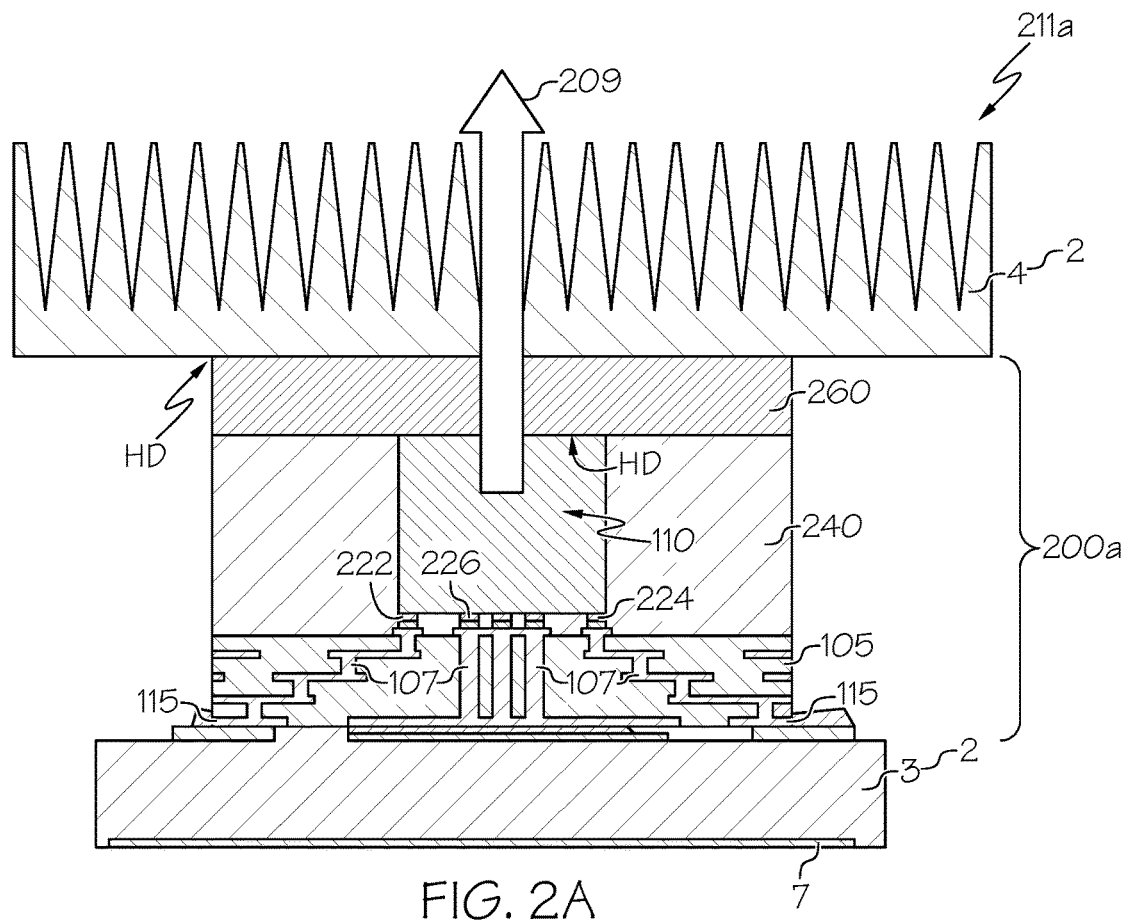
FIGS. 2A and 2B are schematic cross-sectional views of semiconductor device packages including exposed heat dissipating surfaces in accordance with some embodiments of the present disclosure mounted on external devices.
Figure 2B:
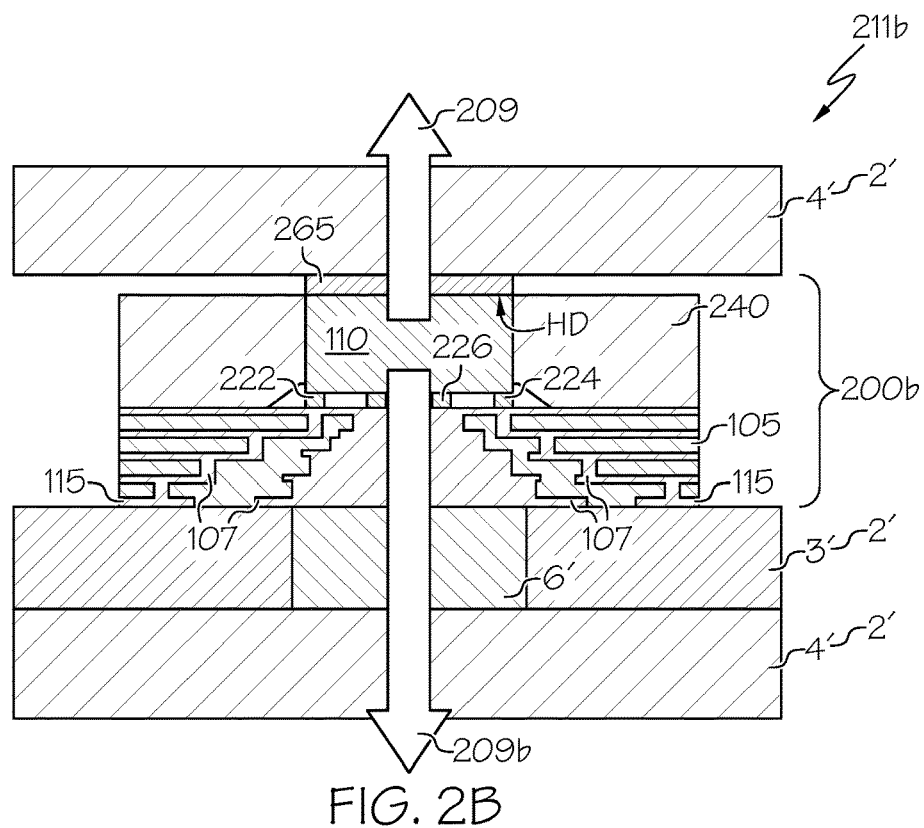

FIGS. 2A and 2B are schematic cross-sectional views of semiconductor device packages 200a and 200b including exposed heat dissipating surfaces HD in accordance with some embodiments of the present disclosure, as mounted on external device or application 2, 2', shown as a circuit board 3, 3' with one or more heat sinks or chassis 4, 4'. In particular, FIGS. 2A and 2B illustrate heat conduction paths 209, 209b in example power amplifiers 211a and 211b (e.g., mMIMO amplifiers).

As shown in FIGS. 2A-2B, the semiconductor device packages 200a, 200b respectively include one or more semiconductor dies 110 mounted on an interconnect structure 105. The semiconductor die(s) 110 may include a semiconductor structure (e.g., a Si-, SiC-, and/or GaN-based structure) defining transistor unit cells therein. The interconnect structure 105 may be a single- or multi-layer laminate, such as a printed circuit board (PCB) or redistribution layer (RDL) laminate structure, with the conductive patterns 107 implemented as conductive traces and/or vias in or on the substrate of the PCB or the RDL laminate structure. The interconnect structure 105 may also be a metal or ceramic structure (e.g., a low temperature ceramic, such as LTCC) including conductive patterns 107 and/or insulating layers or patterns therein or thereon. Terminals (e.g., gate, drain, and/or source terminals, illustrated as conductive bump or pillar structures 222, 224, and/or 226) of the semiconductor die 110 are adjacent a front or active surface of the die 110, and are electrically connected to the conductive patterns of the interconnect structure 105 at a first surface of the interconnect structure 105, in a flip-chip configuration.

The interconnect structure 105 also includes an opposing second surface that is configured to be mounted on or otherwise coupled to the external device 2, 2', also referred to herein as an external device mounting interface or package mounting interface. In the examples of FIGS. 2A and 2B, the interconnect structure 105 includes conductive pads 115 that provide input and output package terminals or leads (referred to herein as package connections) on the second surface. The input and output package connections 115 (e.g., on the second surface of the interconnect structure 105) are configured to electrically connect the semiconductor package 200a, 200b to the external device 2, 2'. The package connections 115 may be configured for land grid array (LGA) or ball grid array (BGA) connections in any of the embodiments described herein.

The die(s) 110 and the interconnect structure 105 are covered or otherwise protected by a mold structure (or other protective structure, such as a lid member) 240. The protective structure 240 may cover or otherwise extend on the die(s) and the interconnect structure 105. For example, the protective structure 240 may be a dispensed and cured encapsulant or compound, such as a plastic or a plastic polymer compound, which is formed so as to encapsulate the die(s) 110 and one or more surfaces of the interconnect structure 105 to provide environmental protection for the packages 200a, 200b. As another example, the protective structure 240 may be a ceramic or other lid member that provides environmental protection for the packages 200a, 200b. The protective structure 240 may be opposite to the external device mounting interface, which in some embodiments is provided by the second surface of the interconnect structure 105.

The protective structure 240 is formed or otherwise configured to expose one or more heat dissipating surfaces HD opposite the interconnect structure 105. In FIG. 2A, the back or inactive surface of the die 110 provides a first heat dissipating surface HD that is exposed by the protective structure 240, and a thermally conductive member 260 on the inactive surface of the die 110 provides a second heat dissipating surface. The thermally conductive member 260 may be a thermally conductive material, such as a metal flange (e.g., a copper coin) that is exposed by the protective structure 240 or is otherwise provided at the top side of the package 200a. In FIG. 2B, the back or inactive surface of the die 110 provides a heat dissipating surface HD that is exposed by the protective structure 240. In further embodiments, the protective structure 240 itself may be thermally conductive (e.g., a thermally conductive lid member) and provides an exposed heat dissipating surface HD. More generally, the protective structure 240 may provide one or more heat dissipating surface(s) HD that are exposed (e.g., by an opening in a protective member or otherwise externally facing) in one or more directions away from the interconnect structure 105.

Heat generated by the die 110 may be dissipated through one or more heat conduction or heat dissipation path(s) 109, 109' that are defined or otherwise provided by the exposed heat dissipating surface(s) HD. In particular, FIG. 2A illustrates a power amplifier configuration 211a in which the semiconductor device package 200a is configured to provide "top" side cooling, via the heat conduction or heat conduction path 209 provided by the first heat dissipating surface HD (the inactive surface of the die 110 exposed by the protective structure 240 opposite the interconnect structure 105), the second heat dissipating surface HD (the surface of the thermally conductive member 260 opposite the interconnect structure 105), and the heat sink 4 on the heat dissipating surface HD at the top of the semiconductor package 200a. The bottom of the semiconductor package 200a (e.g., including the second or bottom surface of the interconnect structure 105) can thus be configured or optimized for electrical performance, such as reduced or minimized impedances. In addition, by routing the heat conduction path 209 away from the external device 2, the external device 2 can be configured to provide additional functionality (e.g., at the back side of the PCB 3). For example, in FIG. 2A, an antenna array 7 is provided on the back side of the PCB 3. Other features providing additional functionality may also be included in or on the PCB 3 by routing the heat conduction path 209 away from the PCB 3 and eliminating associated structures therein (such as the via array 6 in power amplifier 11) that may otherwise be required for heat conduction.

FIG. 2B illustrates an alternative power amplifier configuration 211b in which the semiconductor device package 200b is configured to provide dual side cooling, at both the top and the bottom of the package 200b. As shown in FIG. 2B, a first heat conduction path 209 is provided by the heat dissipating surface HD (the inactive surface of the die 110), which is exposed by the protective structure 240 and is coupled by a thermal interface material (TIM) 265 to a first heat sink 4' at the top of the amplifier 211b. The TIM 265 may be any thermally conducting material, including thermal tape or adhesive, which provides an interface with the heat dissipation surface(s) HD described herein. A second heat conduction path 209b is provided by the conductive pillars or bumps 222, 224, 226 at the active surface of the die 110, which are coupled to conductive patterns or vias 107 extending through the interconnect structure, a thermally conductive flange 6' in the PCB 3', and a second heat sink 4' at the bottom of the amplifier 211b.

Figure 3A:
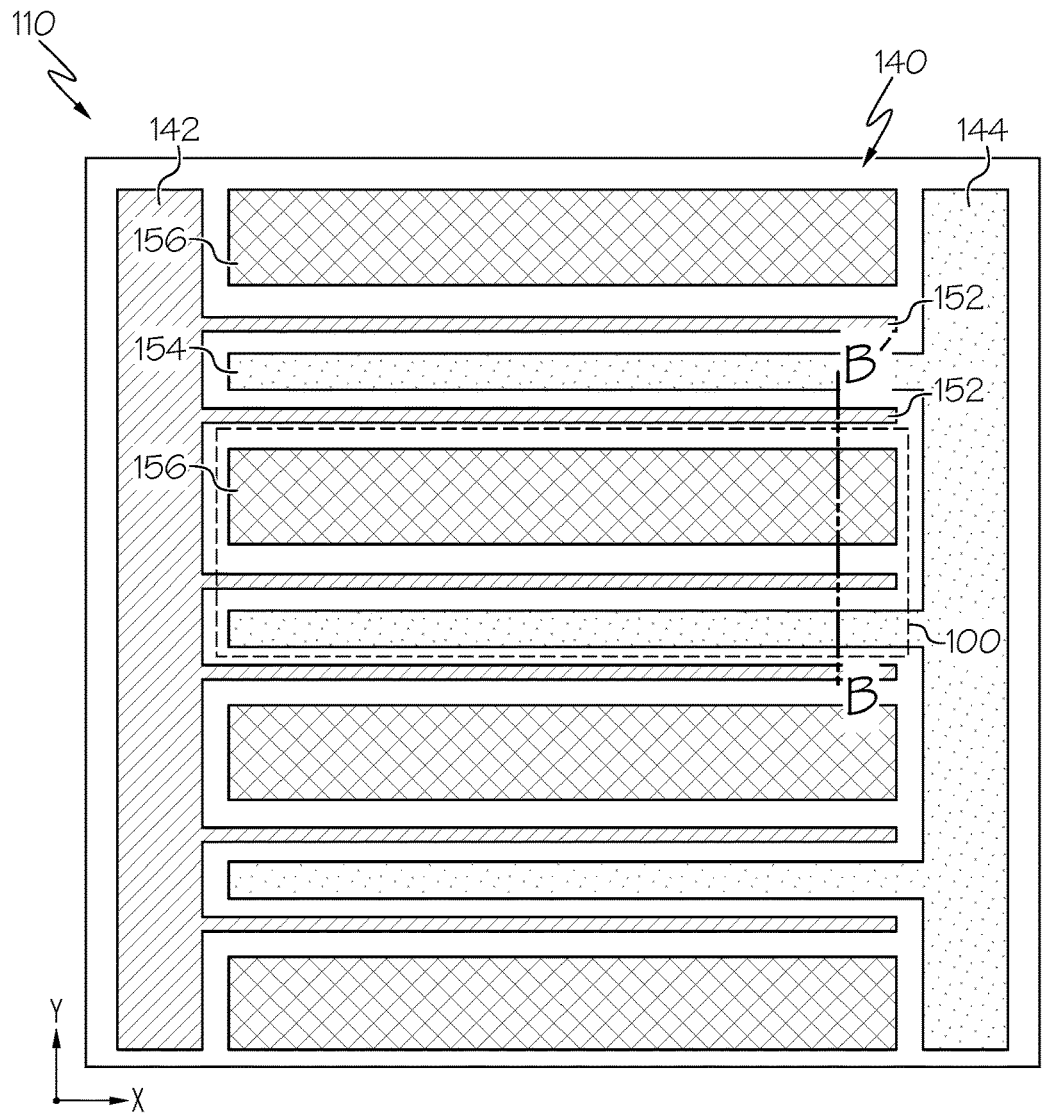
FIG. 3A is a schematic plan view that shows the structure of the top metallization of a power semiconductor device in accordance with some embodiments of the present disclosure, shown by way of example as a high electron mobility transistor.
Figure 3B:
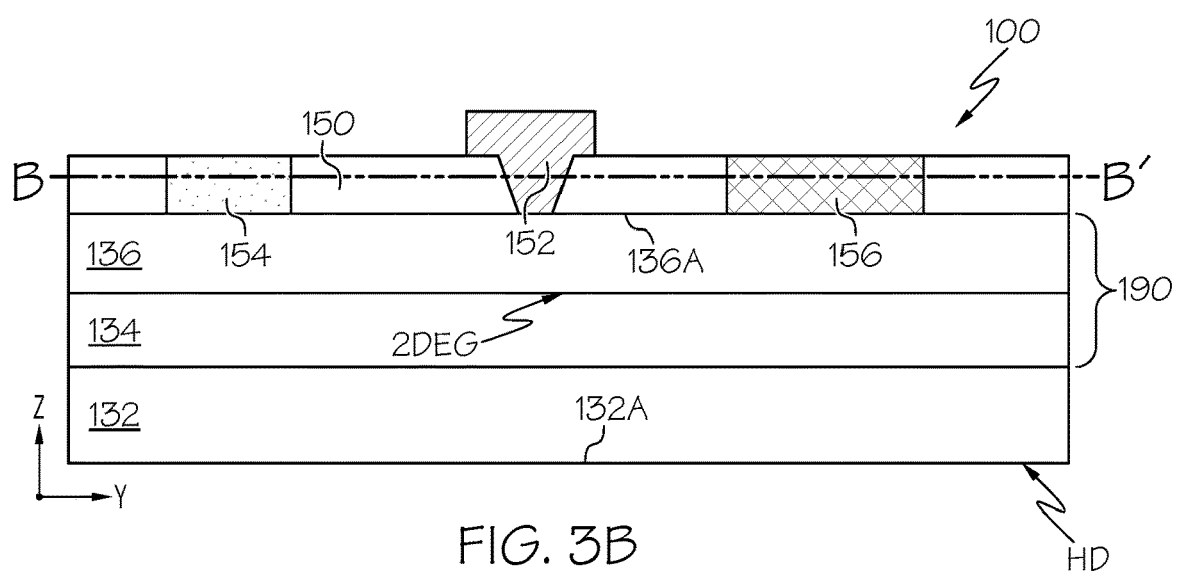
FIG. 3B is a schematic cross-sectional view taken along line B-B' of FIG. 3A that shows the structure of a unit cell transistor of FIG. 3A.

FIG. 3A is a schematic plan view that shows the structure of the top metallization of a semiconductor die 110 in accordance with some embodiments of the present disclosure, shown by way of example as a high electron mobility transistor (HEMT) die. FIG. 3B is a schematic cross-sectional view taken along line B-B' of FIG. 3A that shows the structure of a unit cell transistor of FIG. 3A. While described herein with reference to HEMTs by way of example, it will be understood that embodiments of the present disclosure are not limited to any particular transistor type, and may include, for example, metal-oxide-semiconductor field effect transistor (MOSFET) embodiments, such as laterally diffused MOSFETs (LDMOS) embodiments.

As shown in FIGS. 3A and 3B, a transistor device or die 110 may include multiple transistor unit cells or structures 100 that are connected in parallel to device terminals or electrodes (e.g., an input terminal, an output terminal, and a ground terminal). For example, each of the gate 152, drain 154, and source 156 contacts may extend in a first direction (e.g., the X-direction) to define gate, drain, and/or source 'fingers', which may be connected by one or more respective buses (e.g., by a gate bus and a drain bus adjacent the upper or active surface 136A of the semiconductor structure 190). In particular, the gate fingers 152 are electrically connected to a common gate manifold 142, and the drain fingers 154 are electrically connected to a common drain manifold 144. The gate manifold or bus 142 is electrically connected to a gate terminal 222, which may be implemented as one or more conductive bumps or pillars, and the drain manifold or bus 144 is electrically connected to the drain terminal 224, which may be implemented as one or more conductive bumps or pillars. The source fingers 156 are electrically connected to the source terminal 226, which may be implemented by one or more conductive bumps or pillars.

In FIG. 3A, the gate fingers 152, drain fingers 154, and source fingers 156 extend in parallel to each other, with the gate fingers 152 extending from the gate bus 142 in a first direction and the drain fingers 154 extending from the drain bus 144 in a direction opposite the first direction. Each gate finger 152 may be positioned between a drain finger 154 and a source finger 156 to define the unit cell 100. The gate fingers 152, drain fingers 154, and source fingers 156 (and connecting buses) may define part of gate-, drain-, and source-connected electrodes of the device, respectively, as defined by the top side metallization structure 140. Since the gate fingers 152 are electrically connected to a common gate bus 142, the drain fingers 154 are electrically connected to a common drain bus 144, and the source fingers 156 are electrically connected together, it can be seen that the unit cell transistors 100 are electrically connected together in parallel. One of the terminals of the device (e.g., a source terminal 226 connected to the source contact(s) 156) may be configured to be coupled to a reference signal such as, for example, an electrical ground.

As shown in FIG. 3B, the semiconductor die 110 may be formed on a substrate 132 such as, for example, a SiC, Si, or sapphire substrate, which may include the back or inactive surface 132A that provides a heat dissipation surface HD in some embodiments. With reference to the unit cell structure 100 of FIG. 3B, a channel layer 134 is formed on the substrate 132. A barrier layer 136 is formed on the channel layer 134 opposite the substrate 132. The channel layer 134 may include, for example, gallium-nitride (GaN) and the barrier layer 126 may include, for example, aluminum gallium-nitride (AlGaN). The channel layer 134 and barrier layer 136 may together form a semiconductor layer structure 190 on the substrate 132. A source contact 156 and a drain contact 154 are formed on an upper surface of the barrier layer 136 and are laterally spaced apart from each other. The source contact 156 and the drain contact 154 may form an ohmic contact to the barrier layer 136.

A gate contact 152 is formed on the upper surface of the barrier layer 126 between the source contact 156 and the drain contact 154. A two-dimensional electron gas (2DEG) layer is formed at a junction between the channel layer 134 and the barrier layer 136 when the HEMT device 110 is biased to be in its conducting or "on" state. The 2DEG layer acts as a highly conductive layer that allows current to flow between the source and drain regions of the device that are beneath the source contact 156 and the drain contact 154, respectively. The source contact 156 may be coupled to a reference signal such as, for example, a ground voltage.

In some embodiments, one or more insulating layers 150 may directly contact the upper surface of the semiconductor structure 190 (e.g., contact the upper surface 136A of the barrier layer 136). The one or more insulating layers 150 may serve as passivation layers for the device 110. In some embodiments, additional metal contacts (not shown) may be provided to contact the gate contact 152, the drain contact 154, and/or the source contact 156. For example, conductive pillar structures (e.g., copper pillars) may protrude from the active or front surface 112 of the device 110 to provide electrical connections between the gate contact 152, the drain contact 154, and/or the source contact 156 and an external device or module, such as the external devices 2, 2' described herein. Dielectric layers that isolate the various conductive elements of the top-side metallization structure 140 from each other are not shown in FIG. 3A to simplify the drawing. It will be appreciated that FIGS. 3A and 3B (and various of the other figures) are highly simplified diagrams and that actual semiconductor devices may include many more unit cells and various circuitry and elements that are not shown in the simplified figures herein.

Figure 4A:
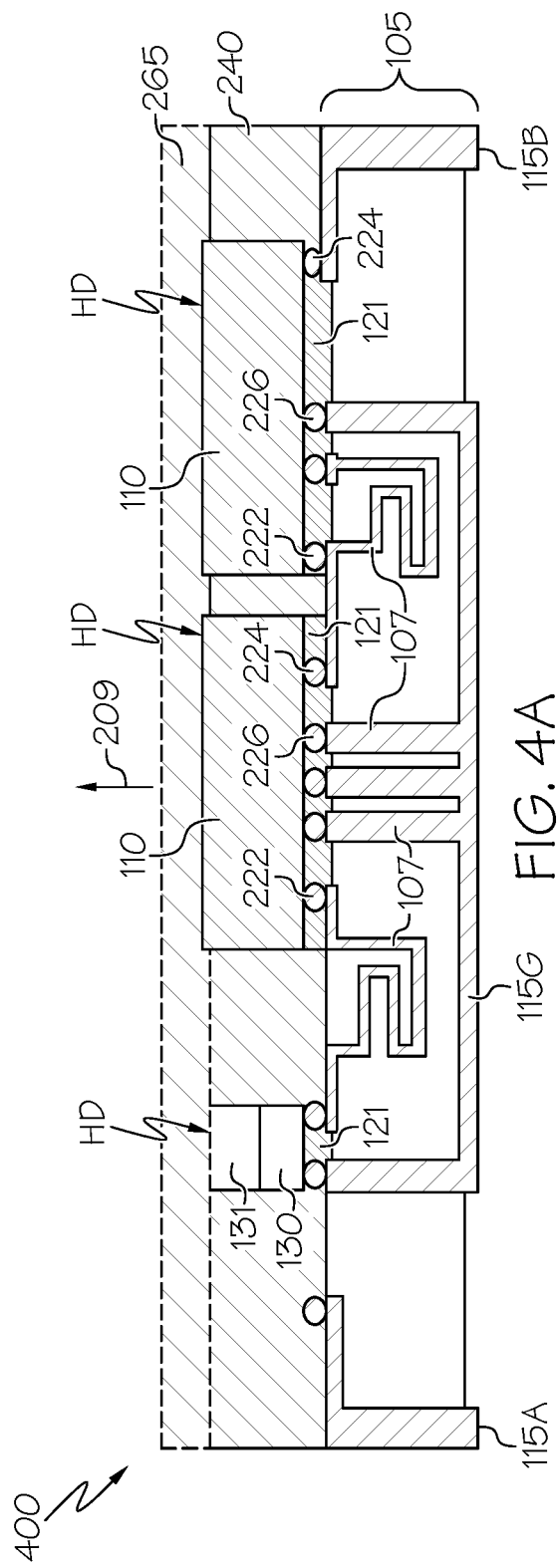
FIG. 4A is a schematic cross-sectional view of a semiconductor device package including inactive or back surfaces of semiconductor dies as exposed heat dissipating surfaces in accordance with some embodiments of the present disclosure.
Figure 4B:
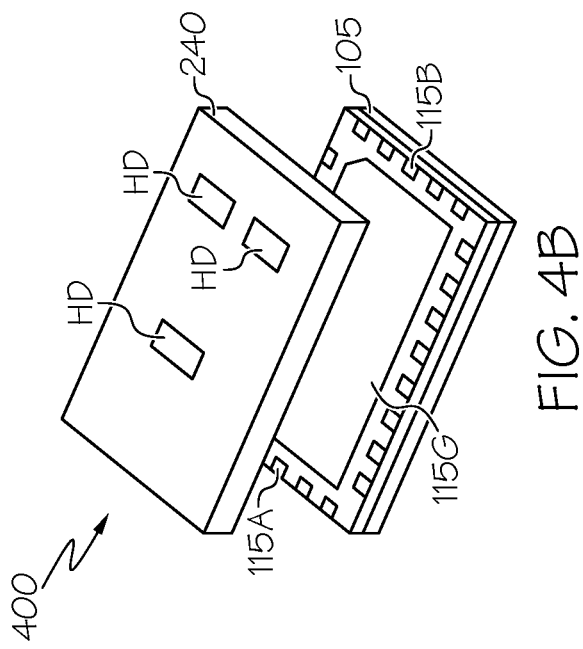
FIG. 4B shows top and bottom perspective views of the semiconductor device package of FIG. 4A.

FIG. 4A is a schematic cross-sectional view of a semiconductor device package 400 including inactive or back surfaces of semiconductor dies 110 as exposed heat dissipating surfaces in accordance with some embodiments of the present disclosure. FIG. 4B shows top and bottom perspective views of the semiconductor device package 400 of FIG. 4A.

As shown in FIGS. 4A and 4B, the semiconductor device package 400 includes one or more semiconductor dies 110 on an interconnect structure 105. The semiconductor die(s) 110 may include semiconductor structures (e.g., a Si-, SiC-, and/or GaN-based structures), in some embodiments defining a plurality of transistors with conduction channels and respective terminals (e.g., gate, drain, and/or source terminals 222, 224, and/or 226) adjacent active surfaces thereof. In some embodiments, one ore more DC blocking capacitances may be integrated with the transistors.

The interconnect structure 105 includes conductive patterns 107 therein and/or thereon. As noted above, the interconnect structure 105 may be a single- or multi-layer laminate, such as a PCB or RDL laminate structure, with the conductive patterns 107 implemented as conductive traces and/or vias therein. The conductive patterns 107 are electrically connected to respective terminals 222, 224, 226 of the die(s) 110 adjacent a first surface of the interconnect structure 105. A second surface of the interconnect structure 105, which is opposite the first surface having the die(s) 110 thereon, provides an interface that is configured to be mounted on or otherwise coupled to an external device, such as a circuit board or other application. In some embodiments, input leads or connections 115A and output leads or connections 115B for the package 400 and a ground lead or connection 115G (collectively, connections 115) may be provided on the second surface of the interconnect structure 105. In the example package 400, the interconnect structure 105 is a multi-layer laminate including conductive patterns 107 that may be fabricated using semiconductor processing techniques, e.g., by depositing conductive and insulating layers and/or patterns on a base material and by forming vias and conductive routing patterns within the structure.

The package 400 may further include various passive electrical components, which may include resistors, inductors, and/or capacitors implemented by discrete devices (e.g., surface mount devices (SMDs), integrated passive devices (IPDs) with thin film substrates such as silicon, alumina, or glass), and/or by elements integrated in the interconnect structure (e.g., spiral inductors, laminate-based transmission lines, etc.). The passive electrical components may be configured, for example, to provide impedance matching and/or harmonic termination circuits, and may be coupled to respective gate 222, drain 224, or source 226 terminals of the transistor die(s) 110 (for example, between the respective terminals 222, 224, or 226 and the input, output, or ground connections 115). As shown in FIG. 4A, a die 130 comprising one or more passive electrical component(s) is implemented in a flip chip configuration, with respective terminals facing the interconnect structure and electrically connected to the conductive patterns. The term "die" as used herein may thus refer to active component dies 110 (e.g., transistor dies) or passive component dies 130 (e.g., capacitor chips or IPDs). Additionally or alternatively, the conductive patterns 107 of the interconnect structure 105 may define one or more passive electrical components (shown with reference to buried spiral inductors by way of example) in some embodiments.

The die(s) 110 are mounted on a first surface of the interconnect structure 105 (with an underfill material 121 therebetween) in a flip chip configuration, with respective terminals 222, 224, and/or 226 on the active surface of the die(s) 110 facing toward the interconnect structure 105 for electrical connection with the conductive patterns 107. The inactive surface of the die(s) 110 faces away from the interconnect structure 105. The passive electrical component die(s) 130 are similarly mounted on the first surface of the interconnect structure 105 in a flip chip configuration, with the back surface facing away from the interconnect structure 105.

A protective structure 240 (in this example, a mold structure) provides environmental protection for the die(s) 110, 130 on the first surface of the interconnect structure 105. For example, the mold structure 240 may be formed of a dispensed and cured encapsulant or compound, such as a plastic or a plastic polymer compound, which encapsulates or otherwise covers the die(s) 110, 130 and one or more surfaces of the interconnect structure 105.

In the semiconductor device package 400, the inactive surfaces of the transistor die(s) 110 provide respective heat dissipating surfaces HD that are exposed by or are otherwise free of the protective structure 240. The back surfaces of the passive electrical component die(s) 130 may likewise provide respective heat dissipating surfaces HD that are exposed by or are otherwise free of the mold structure 240. Thermally conductive spacers 131 may be provided on the back surfaces of the passive electrical component die(s) 130 (and/or on the inactive surfaces of the transistor die(s) 110) to account for height differentials between the die(s) 110 and 130, such that the respective heat dissipating surfaces HD may have similar heights or may be substantially coplanar. In some embodiments, more than one surface of the respective die(s) 110, 130 may be exposed by or free of the protective structure 240, e.g., so as to be facing away from the interconnect structure 105 in one or more directions.

The heat dissipating surface(s) HD may define one or more heat conduction paths 209 that are configured to conduct heat in one or more directions away from the interconnect structure 105 and the external device mounting interface, thereby providing top side cooling for the package 400. In some embodiments, a TIM 265 may be provided on one or more of the exposed heat dissipating surfaces HD, for example, for attachment to an external device or heat sink.

The heat dissipating surface(s) HD of FIGS. 4A and 4B may be recessed in, may protrude from, or may be substantially coplanar with a surface of the protective structure 240 opposite the interconnect structure 105. The heat dissipating surface(s) HD in the package 400 may be exposed by or made free of the protective structure 240 using any of the fabrication methods described herein with reference to FIG. 7A-7C, 8A-8B, or 9A-9B.

Figure 5C:
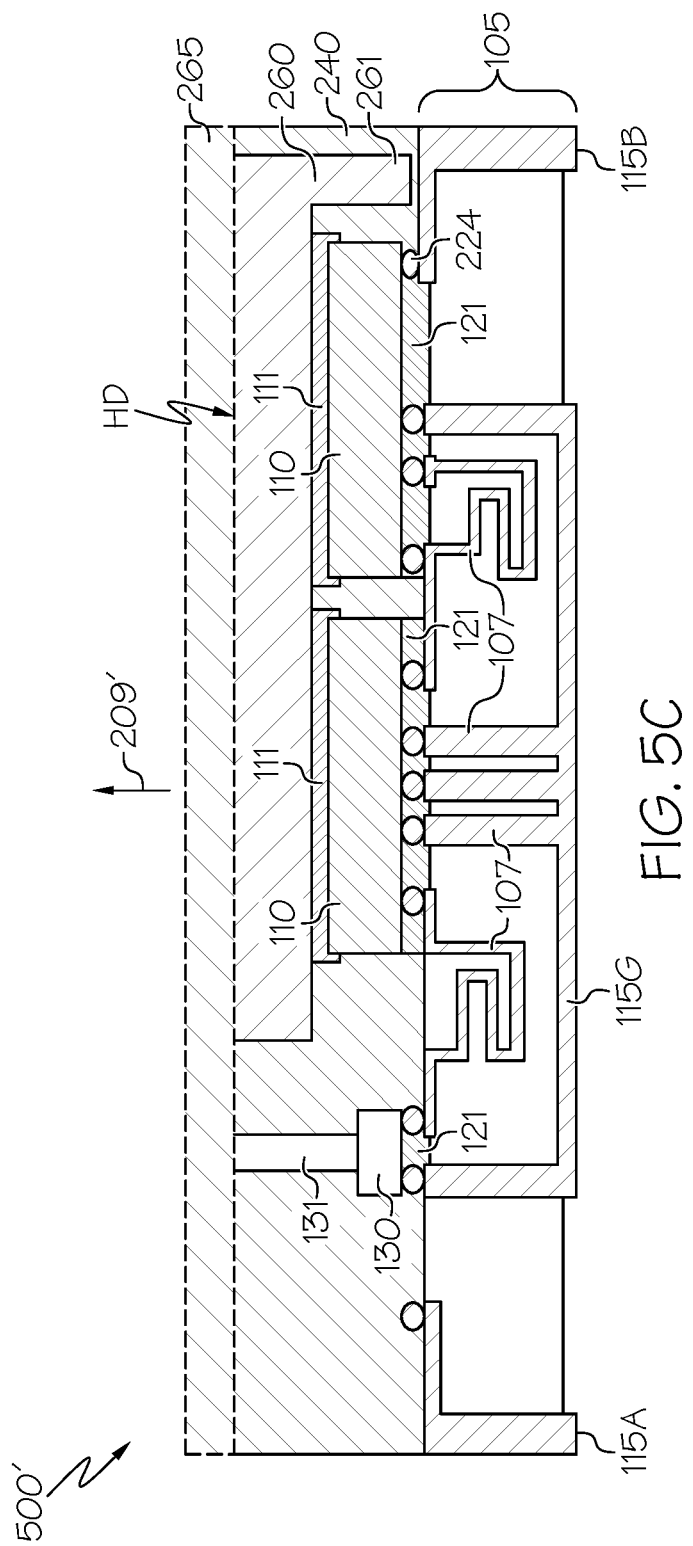
FIG. 5C is a schematic cross-sectional view of a semiconductor device package including a thermally conductive member as an exposed heat dissipating surface with an integrated clip or support structure in accordance with some embodiments of the present disclosure.

FIG. 5A is a schematic cross-sectional view of a semiconductor device package 500 including a thermally conductive member 260 on inactive or back surfaces of semiconductor dies 110 to provide an enlarged exposed heat dissipating surface HD in accordance with some embodiments of the present disclosure. FIG. 5B shows top and bottom perspective views of the semiconductor device package 500 of FIG. 5A. FIG. 5C is a schematic cross-sectional view of a semiconductor device package 500' including a thermally conductive member 260 on inactive or back surfaces of semiconductor dies 110 to provide an enlarged exposed heat dissipating surface HD in accordance with some embodiments of the present disclosure, where the thermally conductive member 260 includes an integrated clip or support structure 261.

As shown in FIGS. 5A, 5B, and 5C, the semiconductor device package 500, 500' includes one or more semiconductor dies 110 on an interconnect structure 105, and various passive electrical components, which may be implemented by discrete devices or dies 130 (e.g., SMDs, IPDs, etc.), and/or by elements formed by the conductive patterns 107 or otherwise integrated in the interconnect structure 105. The interconnect structure 105, the conductive patterns 107 thereof, and the dies 110, 130 mounted thereon may be configured, oriented, and electrically connected in a manner similar to that described above with reference to the package 400 of FIGS. 4A and 4B. A protective structure 240 (in this example, a mold structure) provides environmental protection for the die(s) 110, 130 on the first surface of the interconnect structure 105, similar to the mold structure 240 of the package 400.

In the semiconductor device packages 500, 500' at least one thermally conductive member 260 is provided on the inactive surfaces of the die(s) 110 as a heat dissipating surface HD that is exposed by the protective structure 240. For example, the thermally conductive member 260 may be attached to the surface of the die(s) 110 using solder, conductive nanoparticles (e.g., silver nanoparticles), or other thermally conductive paste or adhesive material 111. The back surfaces of the passive electrical component die(s) 130 may also provide respective heat dissipating surfaces HD that may be coupled to the thermally conductive member 260, e.g., by laterally extending the thermally conductive member 260 over the component(s) 130 and using conductive spacers 131 to account for height differentials between the die(s) 110 and the component(s) 130.

The semiconductor device package 500' further includes at least one clip or support structure 261 that extends between the first surface of the interconnect structure 105 and the thermally conductive member 260 to provide mechanical support and/or to maintain the thermally conductive member 260 substantially parallel to the top and bottom surfaces of the package 500'. In some embodiments, the clip or support structure(s) 261 may comprise a same thermally conductive material as and may integrally extend from the thermally conductive member 260, and in some instances may provide additional heat conduction path(s) away from the interconnect structure 105. In other embodiments, the clip or support structure(s) 261 may be a separate and/or thermally insulating structure that is mechanically coupled to the thermally conductive member 260, e.g., using an adhesive.

The heat dissipating surface HD of the packages 500, 500' may define a heat conduction path 209' that is enlarged relative to the heat conduction path 209 of the package 400, and is similarly configured to conduct heat in one or more directions away from the interconnect structure 105 and the external device mounting interface, thereby providing top side cooling for the packages 500, 500'. In some embodiments, a TIM 265 may be provided on one or more of the exposed heat dissipating surfaces HD, for example, for attachment to an external device or heat sink. The heat dissipating surface HD of FIGS. 5A, 5B, and 5C may be recessed in, may protrude from, or may be substantially coplanar with a surface of the protective structure 240 opposite the interconnect structure 105. The heat dissipating surface HD in the packages 500, 500' may be exposed by or made free of the protective structure 240 using any of the fabrication methods described herein with reference to FIG. 7A-7C, 8A-8B, or 9A-9B.

FIG. 6A is a schematic cross-sectional view of a semiconductor device package 600 including a thermally conductive member 260' on inactive or back surfaces of dies 110, 130 to provide an exposed heat dissipating surface HD that extends up to the length and/or width of the package 600 in accordance with further embodiments of the present disclosure. FIG. 6B shows top and bottom perspective views of the semiconductor device package 600 of FIG. 6A. FIG. 6C is a schematic cross-sectional view of a semiconductor device package 600' including a thermally conductive member 260' on inactive or back surfaces of dies 110, 130 to provide an exposed heat dissipating surface HD that extends up to the length and/or width of the package 600' in accordance with some embodiments of the present disclosure, where the thermally conductive member 260' includes multiple integrated clips or support structures 261. FIG. 6D is a schematic cross-sectional view of a semiconductor device package 600" including multiple thermally conductive members 260" on respective inactive or back surfaces of dies 110, 130 to provide exposed heat dissipating surfaces HD in accordance with some embodiments of the present disclosure As shown in FIGS. 6A, 6B, 6C, and 6D, the semiconductor device packages 600, 600', 600" each include one or more semiconductor dies 110 on an interconnect structure 105, and various passive electrical components, which may be implemented by discrete devices or dies 130 (e.g., SMDs, IPDs, etc.), and/or by elements formed by the conductive patterns 107 or otherwise integrated in the interconnect structure 105. The interconnect structure 105, the conductive patterns 107 thereof, and the dies 110, 130 mounted thereon may be configured, oriented, and electrically connected in a manner similar to that described above with reference to the package 400 of FIGS. 4A and 4B. A protective structure 240 (in this example, a mold structure) provides environmental protection for the die(s) 110, 130 on the first surface of the interconnect structure 105, similar to the mold structure 240 of the package 400.

In the semiconductor device packages 600, 600', 600", at least one thermally conductive member 260', 260" is provided on the inactive surfaces of the die(s) 110, 130 (e.g., using solder or other thermally conductive adhesive material 111) as a heat dissipating surface HD that is exposed by the protective structure 240. The semiconductor device package 600' further includes multiple clips or support structures 261 that extend between the first surface of the interconnect structure 105 and the thermally conductive member 260' to provide mechanical support. In some embodiments, the clips or support structures 261 may comprise a same thermally conductive material as and may integrally extend from the thermally conductive member 260'. In other embodiments, the clips or support structures 261 may be separate and/or thermally insulating structures that are mechanically coupled to the thermally conductive member 260', e.g., using an adhesive. The semiconductor device package 600" further includes multiple thermally conductive members 260" on respective inactive or back surfaces of the dies 110, 130. The back surfaces of the passive electrical component die(s) 130 may be coupled to the thermally conductive member 260', 260" e.g., using conductive spacers 131 thereon to account for height differentials between the die(s) 110, 130.

More generally, the thermally conductive member may include a single thermally conductive member 260' or multiple thermally conductive members 260" that may contact one, some, or all of the dies 110, 130 in the packages 600, 600', 600". The heat dissipating surface(s) HD may extend in one or more dimensions over up to an entirety of the top surface of the packages 600, 600', 600", to define one or more heat conduction paths 209" that is or are enlarged relative to the heat conduction path 209' of the packages 500, 500', and is similarly configured to conduct heat in one or more directions away from the interconnect structure 105 and the external device mounting interface to provide top side cooling for the packages 600, 600'.

In some embodiments, a TIM 265 may be provided on one or more of the exposed heat dissipating surfaces HD, for example, for attachment to an external device or heat sink. The heat dissipating surfaces HD of FIGS. 6A, 6B, 6C, and 6D may be stacked on a surface of the protective structure 240 opposite the interconnect structure 105. The heat dissipating surfaces HD in the packages 600, 600', 600" may be exposed by or made free of the protective structure 240 using any of the fabrication methods described herein with reference to FIG. 7A-7C, 8A-8B, or 9A-9B. The thermally conductive member(s) 260', 260" may be attached to the inactive surfaces of the die(s) 110, 130 opposite the interconnect structure 105 before or after forming the protective structure 240, using any of the fabrication methods described herein with reference to FIGS. 10A-10B and 11A-11D.

Also, while illustrated with transistor dies 110 including gate, source, and drain terminals 222, 224, and 226 on the same surface in FIGS. 5A to 6D, it will be understood that, in any of the packages 500, 500", 600, 600', 600", one or more terminals of the transistor dies 110 at least one of the gate 222, source 226, or drain 224 terminals may be provided on a different or opposite surface of the dies 110 by one or more conductive via structures that extend through dies 110. For example, in some embodiments, the source terminals 226 may be provided on an opposite side (i.e., on the inactive surface) of the dies 110 from the gate 222 and drain 224 terminals on the active surface, and may be grounded or otherwise electrically connected to the thermally conductive members 260, 260', 260". That is, the thermally conductive members 260, 260', 260" may provide both a heat dissipation function and an electrical isolation function in some embodiments.

FIGS. 7A, 7B, and 7C are schematic cross-sectional views illustrating methods of fabricating a semiconductor device package 700 using a film assisted molding process to provide a protective structure 240 that exposes one or more heat dissipating surfaces HD in accordance with some embodiments of the present disclosure.

As shown in FIG. 7A, a mold apparatus 705 including an upper mold chase 710 and a lower mold chase 720 is opened, and one or more interconnect structures 105 (which, in this example, respectively include one or more semiconductor dies 110 and/or 130 flip chip mounted on a first surface thereof, some with thermally conductive members 260 stacked thereon) are loaded into the mold chase 710, 720. For example, a plurality of interconnect structures 105 may be physically connected in a strip or array, and may be handled (automatically or manually) into the mold chase 710, 720 and clamped or otherwise secured in the lower mold chase 720, e.g., by vacuum. The upper mold chase 710 includes a film or tape material 730 loaded therein. The film or tape material 730 is pulled toward the upper mold chase 710, e.g., by vacuum, such that the film or tape material 730 may conformally extend along inner surfaces of the upper mold chase 710.

As shown in FIG. 7B, the mold apparatus 705 is closed by clamping together the upper mold chase 710 and the lower mold chase 720, such that an adhesive surface of the film or tape material 730 is pressed onto or otherwise contacts respective surfaces of the dies 110, 130 and/or thermally conductive members 260 opposite the interconnect structure 105. In the example of FIG. 7B, the interconnect structure 105 includes some dies 110 having a thermally conductive member 260 on inactive surfaces thereof, and other dies 110 that are free of the thermally conductive member 260. As such, the film or tape material 730 contacts an inactive surface of one or more the dies 110, and contacts a thermally conductive member 260 on others of the dies 110. The dies 110 with and without the thermally conductive member 260 on inactive surfaces thereof may extend from the first surface of the interconnect structure 105 to substantially the same height, or to different heights.

The film or tape material 730 may have a thickness and/or compressibility that is configured to at least partially compensate for height variations of the components 110, 130, and/or 260. For example, the film or tape material 730 may be configured to compensate for or allow tolerances of about 20 μm to 50 μm in height variation among the components 110, 130, and/or 260. In some embodiments, the height variation among the components 110, 130, and/or 260 may be less than about 20 μm, for example, about 5 μm to 15 μm. In some embodiments, the film or tape material 730 may have a thickness of about 50 μm to 100 μm.

With the mold apparatus 705 closed and the film or tape material 730 contacting upper surfaces of the components 110, 130, and/or 260 opposite the interconnect structure 105, a mold compound (e.g., plastic or polymer compound) is pressed or otherwise introduced into the mold chase to form the protective structure 240. The mold compound covers the first surface of the interconnect structure 150 and side surfaces of the components 110, 130, and/or 260 thereon. The upper surfaces of the components 110, 130, and/or 260 are covered by the film or tape material 730, which prevents formation of the mold compound thereon.

As such, as shown in FIG. 7C, upon removal from the mold apparatus 705, the semiconductor device package 700 includes one or more heat dissipating surfaces HD that are exposed by or otherwise free of the protective structure 240 (here, the mold compound) opposite the interconnect structure 105. In the package 700, the heat dissipating surfaces HD include surfaces of dies 110, 130 or thermally conductive members 260 thereon that are exposed by the protective structure 240, e.g., opposite the interconnect structure 105. A second or bottom surface of the interconnect structure 105 includes input leads or connections 115A and output leads or connections 115B and a ground lead or connection 115G for the package 700, or is otherwise configured to be mounted on an external device, such as on a circuit board or other customer application.

The film assisted molding process shown in FIGS. 7A to 7C may be advantageous in that the protective structure 240 can be formed such that the heat dissipating surfaces HD (e.g., the surfaces of the die(s) 110, passive component(s), or thermally conductive member(s) 260) can be exposed without the use of mechanical force, and without removing portions of the semiconductor material or metal material of the components 110, 130, and/or 260. Also, the exposed the heat dissipating surfaces HD of the components 110, 130, and/or 260 may not require post-plating for attachment to an external device, heat sink, or other customer applications. However, the film assisted molding process shown in FIGS. 7A to 7C may subject the components 110, 130, and/or 260 to higher pressures or stress (which could damage the flip-chip connections), and may require expensive processing and molding equipment.

FIGS. 8A and 8B are schematic cross-sectional views illustrating methods of fabricating semiconductor device packages 800 using a back grinding process to provide a protective structure 240 that exposes one or more heat dissipating surfaces HD in accordance with some embodiments of the present disclosure.

As shown in FIG. 8A, interconnect structures 105 respectively include one or more dies 110, 130 flip chip mounted on a first surface thereof. A thermally conductive sheet or panel 260p is attached to respective surfaces of the dies 110 and/or 130 opposite the interconnect structures 105, for example, using a thermally conductive adhesive 111. The thermally conductive panel 260p may be a metal sheet (e.g. a copper (Cu) sheet) or other thermally conductive material that is configured to be diced or otherwise singulated to define respective thermally conductive members 260, 260' as described herein. For example, the thermally conductive panel 260p may include tie bar elements 211 that physically connect portions of the thermally conductive panel 260p and are configured to be cut to define the respective thermally conductive members 260, 260'. The tie bar elements 211 may be implemented by sections of the panel 260p that are notched or otherwise thinner than the remainder of the panel 260p. The tie bar elements 211 may be defined by pre-etching the sections of the thermally conductive panel 260p. The pre-etching may define mold lock features 212 in the thermally conductive panel 260p.

Still referring to FIG. 8A, a preliminary protective structure 240p (in this example, an encapsulating mold structure as described herein) is formed on the first surface of the interconnect structures 105, the dies 110, 130 that are flip chip mounted thereon, and the thermally conductive panel 260p on the dies 110 and/or 130 opposite the interconnect structures 105. The preliminary protective structure 240p is formed so as to cover one or more surfaces of the dies 110, 130 and the interconnect structure 105, and the thermally conductive panel 260p, including the surface of the panel 260p opposite the interconnect structures 105. In some embodiments, the mold lock features 212 in the thermally conductive panel 260p may improve adhesion and/or provide mechanical support between the thermally conductive panel 260p (and the resulting thermally conductive members 260) and the mold structure.

A mechanical grinding or lapping process (e.g., using a rotating or other grinding apparatus 805) is performed to remove portions of the preliminary protective structure 240p and expose the surface of the panel 260p e.g., opposite the interconnect structures 105, as shown in FIG. 8B. The exposed surface of the panel 260p thus defines one or more heat dissipating surfaces HD that are exposed by a protective structure 240 (defined by the remaining portions of the preliminary protective structure 240p). The panel 260p, the protective structure 240, and the underlying interconnect structures 105 may be diced or otherwise singulated (e.g., along the dashed line shown in FIG. 8B) to define respective semiconductor device packages 800, each with a respective heat dissipating surface HD (defined by the respective thermally conductive members 260 resulting from the singulation process) opposite a respective interconnect structure 105. The heat dissipating surfaces may extend in one or more dimensions over up to an entirety of the top surface of the packages 800, which may be similar to the packages 600, 600' of FIGS. 6A to 6C. In some embodiments, one or more side surfaces of the thermally conductive members 260 (e.g., portions of the tie bar elements 211 that are exposed by the protective structure after singulation) may also provide respective heat dissipating surfaces HD.

The mechanical griding or lapping process to expose the heat dissipating surfaces HD shown in FIGS. 8A and 8B may be advantageous in that the heat dissipating surfaces HD (e.g., the exposed surfaces of the thermally conductive member(s) 260) can be exposed in a relatively inexpensive manner, and may be simultaneously planarized to provide a level surface HD despite imperfections or variations in the placement of the thermally conductive member(s) 260 (e.g., even if the members 260 are tilted, for example, due to height variations of the underlying components or dies 110, 130 to which the members 260 are mounted). However, the mechanical griding or lapping process may subject the components 110, 130, and/or 260p to higher pressures or stress (which could damage the flip-chip connections), and/or may require post-plating for attachment to an external device, heat sink, or other customer applications.

Figure 9A:
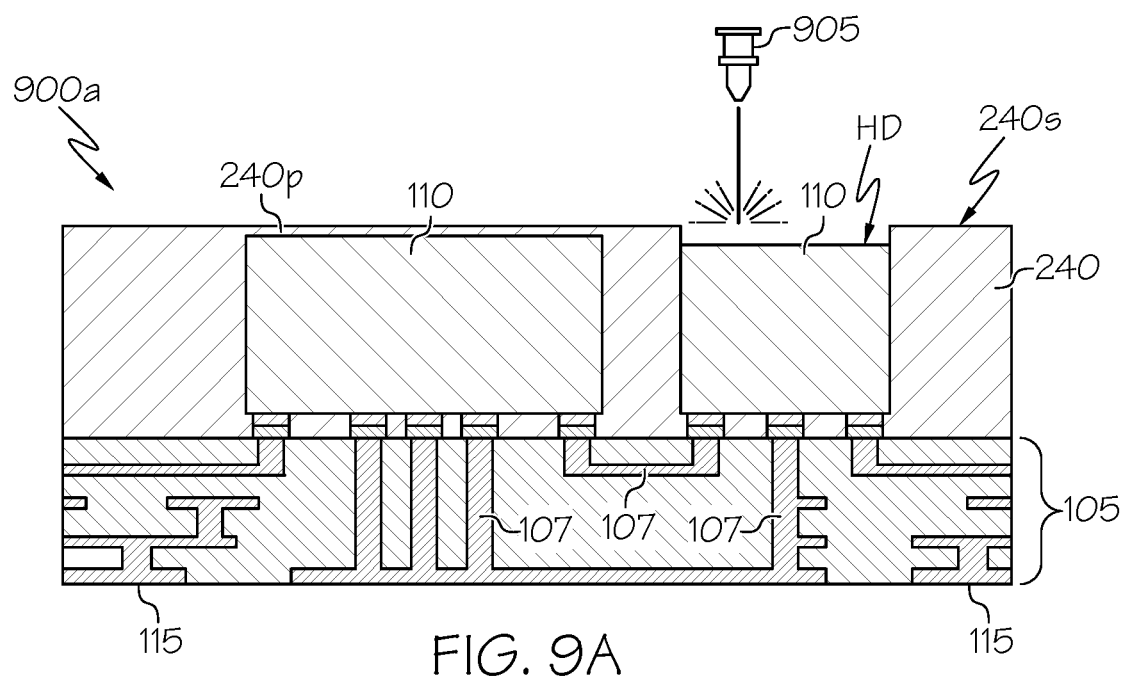
FIGS. 9A and 9B are schematic cross-sectional views illustrating methods of fabricating semiconductor device packages using a laser ablation process to expose heat dissipating surfaces in accordance with some embodiments of the present disclosure.
Figure 9B:
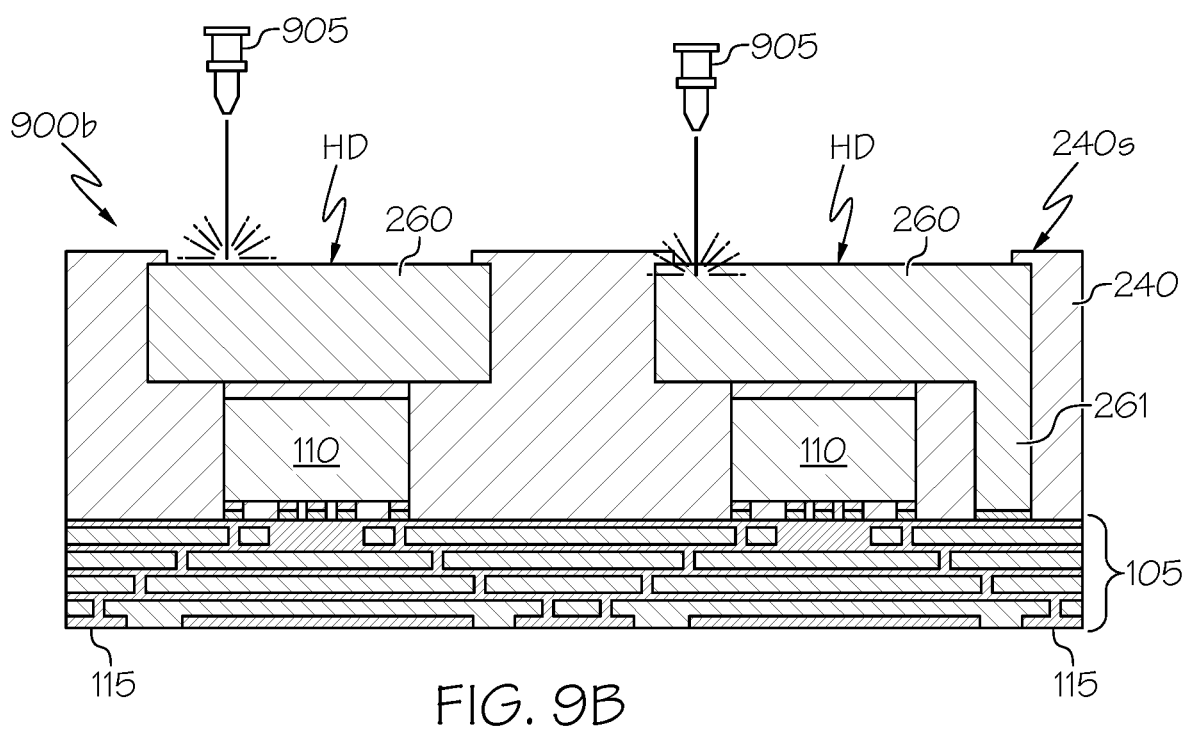

FIGS. 9A and 9B are schematic cross-sectional views illustrating methods of fabricating semiconductor device packages 900a and 900b using a laser ablation process to provide a protective structure 240 that exposes one or more heat dissipating surfaces HD in accordance with some embodiments of the present disclosure.

As shown in FIGS. 9A and 9B, interconnect structures 105 respectively include one or more active component semiconductor dies 110 flip chip mounted on a first surface thereof. Although not shown, one or more passive electrical component dies 130 may be similarly flip chip mounted on the first surface of the interconnect structures 105 adjacent the dies 110. A preliminary protective structure 240p (in this example, an encapsulating mold structure as described herein) is formed on one or more surfaces of the interconnect structures 105 and the semiconductor dies 110 (and/or passive electrical component dies) flip chip mounted thereon. In FIG. 9A, the preliminary protective structure 240p is formed on the inactive surfaces of the semiconductor dies 110 opposite the interconnect structure 105. In FIG. 9B, respective thermally conductive members 260 are provided on the inactive surfaces of the semiconductor dies 110 opposite the interconnect structure 105, and the preliminary protective structure 240p is formed on the surfaces of the thermally conductive members 260 opposite the interconnect structure 105.

A laser ablation process (e.g., using a laser 905) is performed to remove portions of the preliminary protective structure 240p and expose the inactive surfaces of the semiconductor dies 110 (in FIG. 9A) and/or the surfaces of the thermally conductive member 260 (in FIG. 9B), e.g., opposite the interconnect structures 105, thereby defining semiconductor device packages 900a and 900b with respective heat dissipating surfaces HD that are exposed by a protective structure 240 (defined by the remaining portions of the preliminary protective structure 240p) and are facing away from the interconnect structures 105 in one or more directions. The package 900a of FIG. 9A may be similar to the packages 400 of FIGS. 4A to 4B, while the package 900b of FIG. 9B may be similar to the packages 500, 500' of FIGS. 5A to 5C.

The laser ablation process to expose the heat dissipating surfaces HD shown in FIGS. 9A and 9B may be advantageous in that the heat dissipating surfaces HD (e.g., the surfaces of the semiconductor dies 110, passive components, and/or the thermally conductive members 260 opposite the interconnection structure 105) can be locally exposed in relatively small areas of the top surfaces of the packages 900a, 900b, without subjecting the semiconductor dies 110, passive components, and/or the thermally conductive members 260 to higher pressures or stress (which could damage the flip-chip connections). However, as a result of the laser ablation process, the heat dissipating surfaces HD may be recessed relative to the adjacent or surrounding surface(s) 240s of the protective structure 240. The recess may define a step difference between the heat dissipating surfaces HD and the surrounding surface 240s of less than about 20 microns, for example, about 1 to 15 microns. The step difference may be less than a few hundred microns in some embodiments. A post-plating process may be performed for subsequent attachment of the heat dissipating surfaces HD to an external device, heat sink, or other customer applications.

Figure 10A:
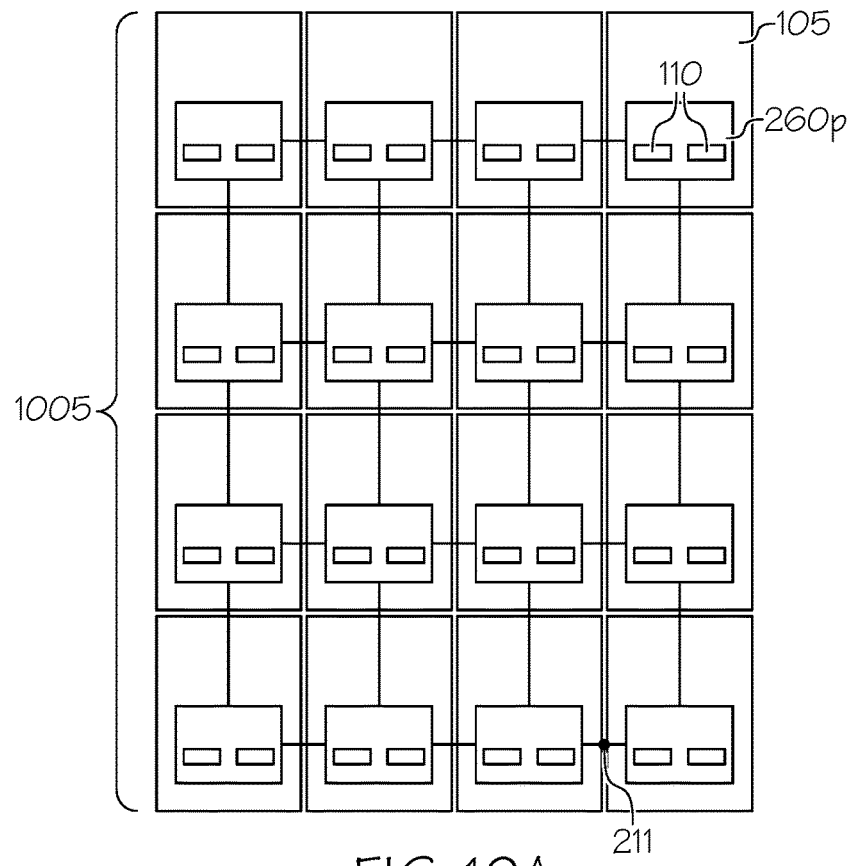
FIG. 10A is a plan view and FIG. 10B is a cross-sectional view illustrating methods of fabricating semiconductor device packages by forming a thermally conductive member on inactive or back surfaces of semiconductor dies before forming a mold structure thereon, in accordance with some embodiments of the present disclosure.
Figure 10B:
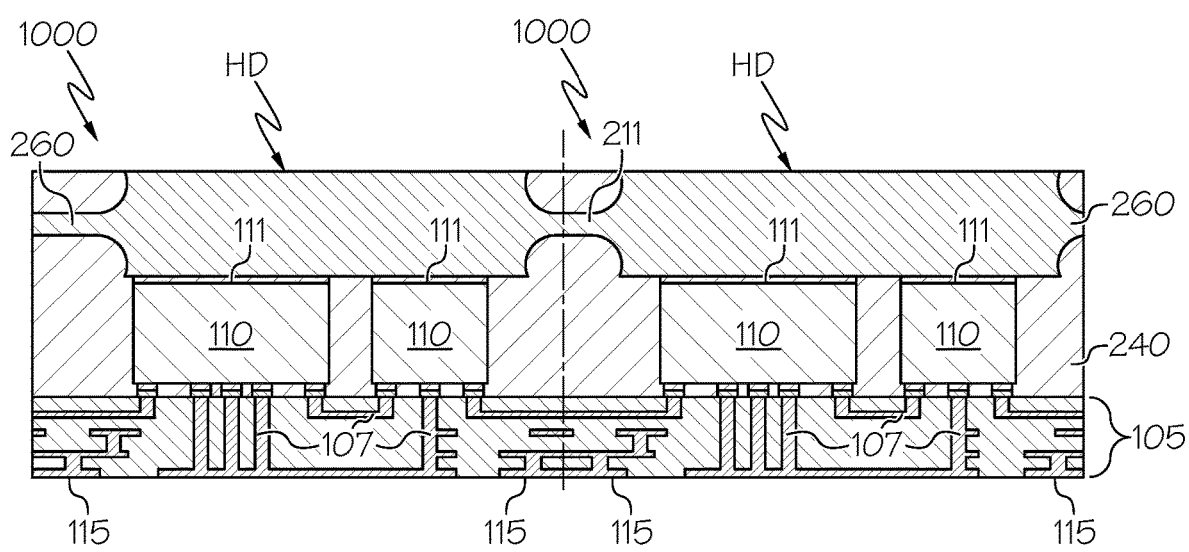

FIG. 10A is a plan view and FIG. 10B is a cross-sectional view illustrating methods of fabricating semiconductor device packages 1000 in accordance with some embodiments of the present disclosure. The methods shown in FIGS. 10A and 10B form a thermally conductive member 260 on inactive or back surfaces of semiconductor dies 110 (or passive electrical components) before forming a protective structure 240 for the package 1000.

As shown in FIGS. 10A and 10B, interconnect structures 105 respectively include one or more semiconductor dies 110 (and/or passive electrical components; not shown) that are flip chip mounted on a first surface of the interconnect structures 105. A plurality of interconnect structures 105 may be physically connected in a strip or array 1005. A thermally conductive sheet or panel 260p is attached to respective surfaces of the components or dies 110 opposite the interconnect structures 105, for example, using a thermally conductive adhesive 111. The thermally conductive panel 260p may be a metal sheet (e.g. a copper (Cu) sheet) or other thermally conductive material including tie bar elements 211 that physically connect portions of the thermally conductive panel 260p. The tie bars 211 are configured to be cut to be diced or otherwise singulated to define respective thermally conductive members 260.

A protective structure 240 is formed to expose the surface of the thermally conductive panel 260p opposite the interconnect structures 105. In particular, the protective structure 240 (shown in this example as a mold structure) is formed on the first surface of the interconnect structures 105 and on side surfaces of the semiconductor dies 110 (and/or passive electrical components) mounted thereon, but not on the surfaces of the semiconductor dies 110 (and/or passive electrical components) that are covered by the panel 260p. In some embodiments, portions of the protective structure 240 may be formed on the surface of the thermally conductive panel 260p opposite the dies 110, the portions of the protective structure 240 may be removed (e.g., using the mechanical grinding or lapping process of FIGS. 8A and 8B or the laser ablation process of FIGS. 9A and 9B) to expose the surface of the panel 260p opposite the interconnect structures 105.

The surface of the panel 260p thus defines one or more heat dissipating surfaces HD that are exposed by a protective structure 240, e.g., opposite the interconnect structures 105. The panel 260p, the protective structure 240, and the underlying interconnect structures 105 may be diced or otherwise singulated (e.g., along the dashed line shown in FIG. 10B) to define respective semiconductor device packages 1000, each with a respective heat dissipating surface HD (defined by the respective thermally conductive members 260 resulting from the singulation process) opposite a respective interconnect structure 105. The heat dissipating surfaces HD may extend in one or more dimensions over up to an entirety of the top surface of the packages 1000, similar to the packages 600, 600' of FIGS. 6A to 6C.

Figure 11A:
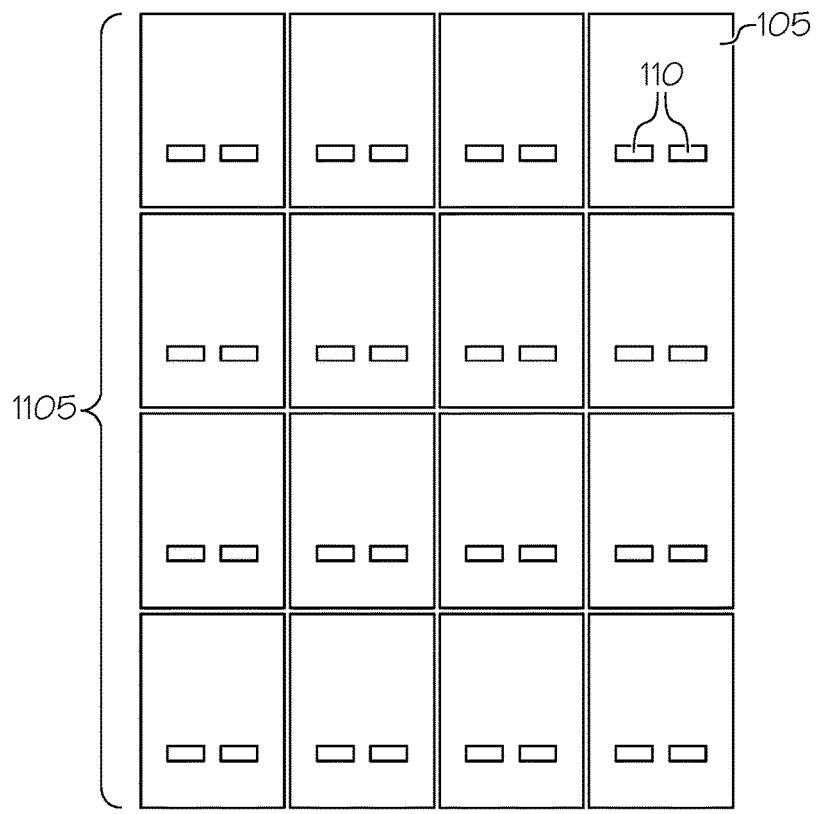
FIG. 11A is a plan view and FIGS. 11B, 11C, and 11D are cross-sectional views illustrating methods of fabricating semiconductor device packages by forming a thermally conductive member on inactive or back surfaces of semiconductor dies after forming a mold structure thereon, in accordance with some embodiments of the present disclosure.
Figure 11B:
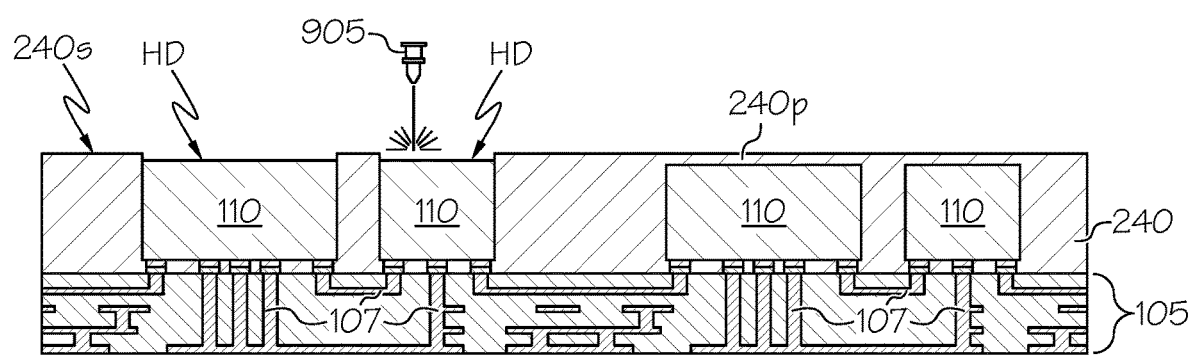
Figure 11C:
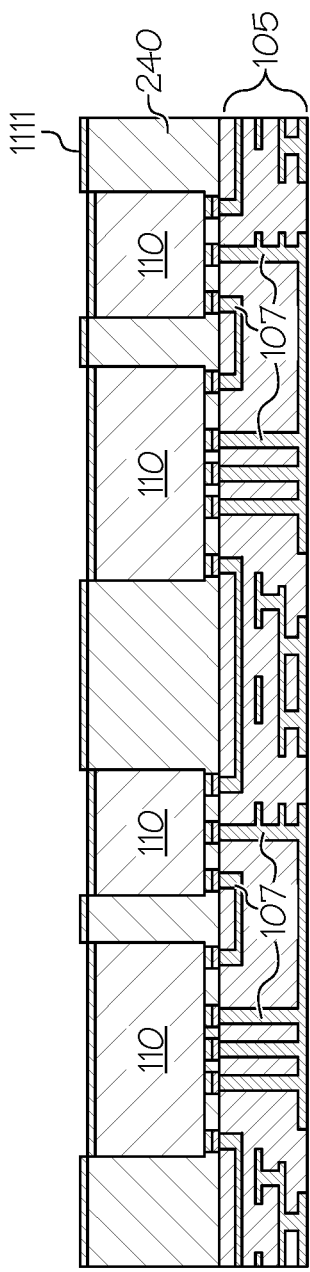
Figure 11D:
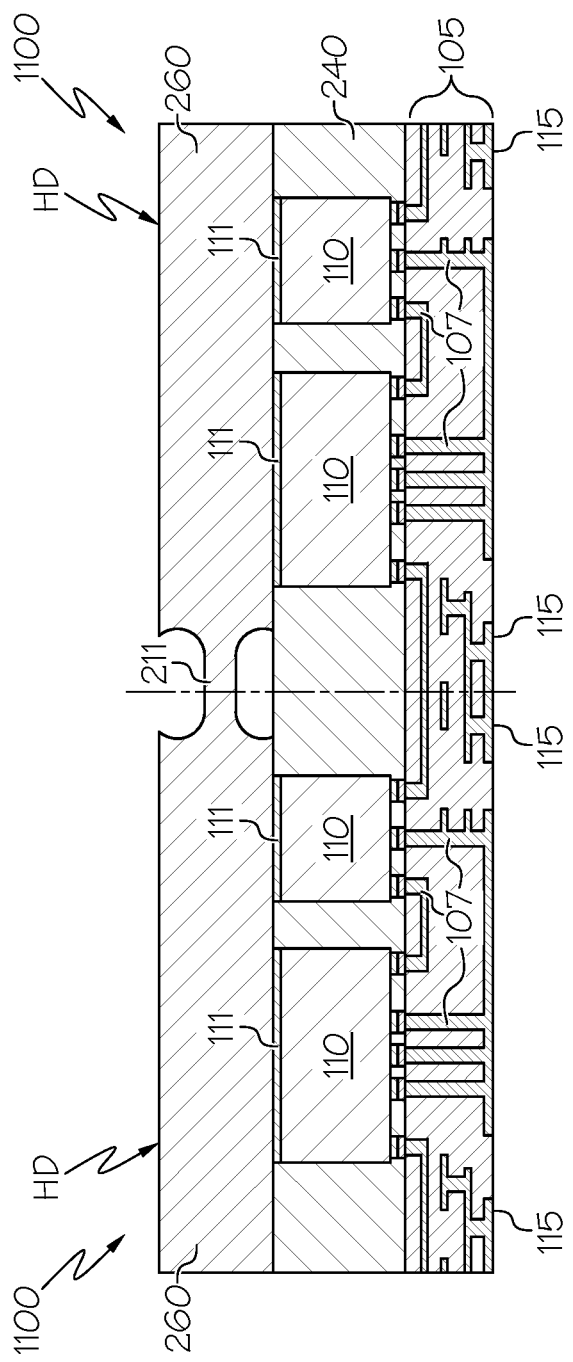

FIG. 11A is a plan view and FIGS. 11B, 11C, and 11D are cross-sectional views illustrating methods of fabricating semiconductor device packages 1100 in accordance with some embodiments of the present disclosure. The methods shown in FIG. 11A to 11D form a thermally conductive member 260 on inactive or back surfaces of semiconductor dies 110 (or passive electrical components) after forming a protective structure 240 for the package 1000.

As shown in FIGS. 11A and 11B, interconnect structures 105 respectively include one or more semiconductor dies 110 (and/or passive electrical components; not shown) that are flip chip mounted on a first surface of the interconnect structures 105. A plurality of interconnect structures 105 may be physically connected in a strip or array 1105. A preliminary protective structure 240p (in this example, an encapsulating mold structure as described herein) is formed on one or more surfaces of the interconnect structures 105 and on back surfaces (e.g., inactive surfaces) and side surfaces of the semiconductor dies 110 (and/or passive electrical components) that are flip chip mounted thereon. A laser ablation process is performed using a laser 905 to remove portions of the preliminary protective structure 240p and expose the inactive surfaces of the semiconductor dies 110 (and/or passive electrical components) as heat dissipating surfaces HD. As a result of the laser ablation process, the heat dissipating surfaces HD may be recessed relative to the adjacent or surrounding surface(s) 240s of the protective structure 240.

As shown in FIG. 11C, a metal or other attachment layer 1111 is deposited (e.g., by sputtering) on the surface 240s of the protective structure 240 and on the exposed heat dissipating surfaces HD. The metal or other attachment layer 1111 may be configured to increase adhesion to the surface 240s of the protective structure 240 and the exposed heat dissipating surfaces HD of the semiconductor dies 110 (and/or passive electrical components).

As shown in FIG. 11D, a thermally conductive adhesive material 111 (e.g., solder, conductive nanoparticles (e.g., silver nanoparticles), or other thermally conductive paste or adhesive material) is formed on the attachment layer 1111, and a thermally conductive panel 260p is attached to the surface 240s of the protective structure 240 and the respective heat dissipating surfaces HD of the semiconductor dies 110 (and/or passive electrical components). The thermally conductive panel 260p may be a metal sheet (e.g. a Cu sheet) or other thermally conductive material including pre-etched saw streets or tie bar elements 211 that physically connect portions of the thermally conductive panel 260p. The tie bars 211 are configured to be cut to be diced or otherwise singulated to define respective thermally conductive members 260.

The surface of the panel 260p thus defines one or more heat dissipating surfaces HD that are exposed by a protective structure 240, e.g., opposite the interconnect structures 105. The panel 260p, the protective structure 240, and the underlying interconnect structures 105 may be diced or otherwise singulated (e.g., along the dashed line shown in FIG. 11D) to define respective semiconductor device packages 1100, each with a respective heat dissipating surface HD (defined by the respective thermally conductive members 260 resulting from the singulation process) opposite a respective interconnect structure 105. The heat dissipating surfaces HD may extend in one or more dimensions over up to an entirety of the top surface of the packages 1100, similar to the packages 600, 600' of FIGS. 6A to 6C.

Figure 14:
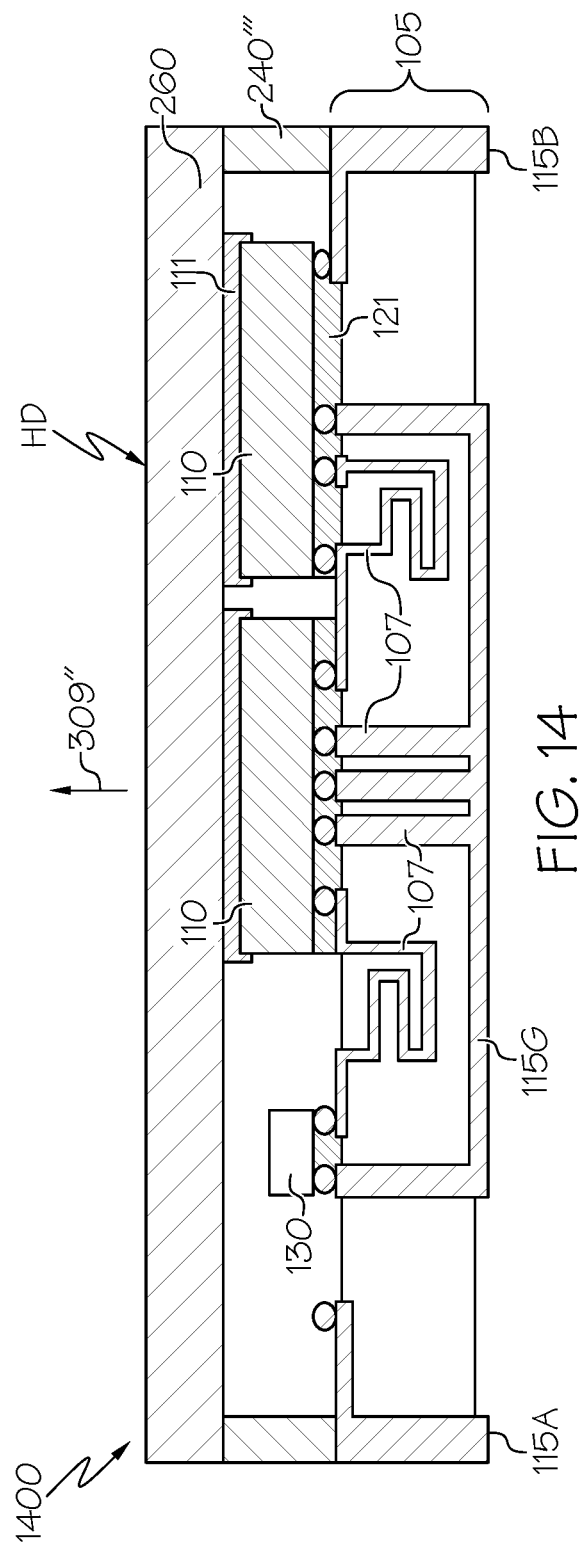
FIG. 14 is a schematic cross-sectional view of a semiconductor device package including a thermally conductive member as an heat dissipating surface supported by sidewalls of a lid member in accordance with further embodiments of the present disclosure.

FIGS. 12, 13, and 14 are schematic cross-sectional views of semiconductor device packages 1200, 1300, and 1400 including protective structures implemented by lid members 240', 240", 240'" that expose or otherwise provide heat dissipating surfaces HD in accordance with some embodiments of the present disclosure.

As shown in FIGS. 12, 13, and 14, semiconductor device packages 1200, 1300, 1400 respectively include one or more semiconductor dies 110 on an interconnect structure 105, and various passive electrical components, which may be implemented by discrete devices or dies 130 (e.g., SMDs, IPDs, etc.), and/or by elements formed by the conductive patterns 107 or otherwise integrated in the interconnect structure 105. The interconnect structure 105, the conductive patterns 107 thereof, and the dies 110, 130 mounted thereon may be configured, oriented, and electrically connected in a manner similar to that described above with reference to the package 400 of FIGS. 4A and 4B.

In contrast to the packages illustrated in the embodiments of FIGS. 4A to 11D including mold structures for environmental protection as described above, the semiconductor device packages 1200, 1300, 1400 include protective structures 240', 240", 240'" implemented as lid members for environmental protection. The protective structures 240', 240", 240'" may be formed of a ceramic or other material and are configured to enclose the die(s) 110, 130 on the first surface of the interconnect structure 105 in an open cavity. In some embodiments, the protective structures 240', 240", 240'" may be formed of materials having at least some thermal conductivity, and thus may function as heat dissipating surfaces HD. The protective structures 240', 240", 240'" may be secured to one or more surfaces of the interconnect structure 105 using an adhesive.

In the semiconductor device packages 1200, 1300, 1400, at least one thermally conductive member 260 is provided on the inactive surfaces of the die(s) 110, e.g., opposite the interconnect structure 105. For example, the thermally conductive member 260 may be attached to the surface of the die(s) 110 using solder, conductive nanoparticles (e.g., silver nanoparticles), or other thermally conductive paste or adhesive material 111. The back surfaces of the passive electrical component die(s) 130 may also provide respective heat dissipating surfaces HD that may be coupled to the thermally conductive member 260, e.g., by laterally extending the thermally conductive member 260 over the die(s) 130 and using conductive spacers 131 thereon to account for height differentials between the die(s) 110 and the component(s) 130. While not illustrated, one or more clip or support structures (e.g., 261) may extend between the first surface of the interconnect structure 105 and the thermally conductive member 260 to provide mechanical support for the thermally conductive member 260.

In the example of FIG. 12, one or more surfaces of the thermally conductive member 260 are in physical contact with the protective structure 240'. The protective structure 240' may be a protective lid member formed of a ceramic or other material having sufficient thermal conductivity to transfer heat from the surface of the thermally conductive member 260 to one or more heat conduction paths 309 that are configured to conduct heat in one or more directions away from the interconnect structure 105. As such, the protective structure 240' not only encloses the components or dies 110, 130 on the interconnect structure 105 in an open cavity, but itself provides one or more heat dissipating surfaces HD configured to conduct heat in one or more directions opposite or away from the external device mounting interface on the bottom surface of the interconnect structure 105, thereby providing top side cooling for the package 1200. That is, the thermally conductive member 260 is not exposed by the protective member 240', but may sufficiently spread heat from the dies 110, 130 for dissipation, even in embodiments where the protective member 240' does not itself provide high thermal conductivity.

In the example of FIG. 13, the lid member 240" includes an opening therein that is spatially registered with the surface of the thermally conductive member 260. For example, the opening in the protective structure 240" may provide a cavity that is sized to accept or otherwise expose the surface of the thermally conductive member 260 opposite the interconnect structure 105. As such, the surface of the thermally conductive member 260 provides the heat dissipating surface HD exposed by the protective structure 240" opposite the interconnect structure 105. The heat dissipating surface HD of FIG. 13 may be recessed in, may protrude from, or may be substantially coplanar with a surface of the protective structure 240" opposite the interconnect structure 105. The heat dissipating surface HD may thus define a heat conduction path 309' that is configured to conduct heat in one or more directions away from the interconnect structure 105 and the external device mounting interface, thereby providing top side cooling for the package 1300.

In the example of FIG. 14, the externally-facing surface(s) of the thermally conductive member 260 also provide one or more heat dissipating surface HD opposite or otherwise facing away from the interconnect structure 105 in one or more directions, and is mechanically supported by portions of the protective structure 240''' so as to enclose the components or dies 110, 130 in an open cavity. In particular, the protective structure 240''' extends around a periphery of the dies 110, 130 to define sidewalls or side surfaces of the package 1400. The thermally conductive member 260 extends in one or more dimensions over up to an entirety of the top surface of the package 1400, defining both a heat dissipating surface HD and providing environmental protection for the dies 110, 130. The heat dissipating surface HD defines a heat conduction path 309" that is enlarged relative to that of the package 1300, but is similarly configured to conduct heat in one or more directions away from the interconnect structure 105 and the external device mounting interface to provide top side cooling for the package 1400. In FIGS. 13 and 14, the protective structures 240" and/or 240''' may not be required to be thermally conductive, and may be formed of thermally insulating materials in some embodiments.

Embodiments of the present disclosure thus provide semiconductor device packages with one or more heat dissipating surfaces opposite or otherwise facing away from the package mounting interface in one or more directions, allowing for one or more heat conduction paths in directions opposite to or otherwise away from an external device (e.g., a circuit board or other customer application). Such top side cooling may reduce complexity requirements for external devices or applications, for example, by removing requirements for through-vias or other heat conduction paths through the external device. In addition, embodiments of the present disclosure may also provide improved thermal capabilities, for example, by establishing heat conduction paths that are separate or independent from electrical ground paths (e.g., by providing the source terminals on the front surface of the transistor die, and providing the heat conduction path(s) by coupling the back surface of the transistor die to the thermally conductive member), which may otherwise be difficult or impossible to achieve without flip chip interconnection schemes as described herein.

Embodiments of the present disclosure may be used in mMIMO or other lower power/lower frequency products, but also higher power/higher frequency RF power products that may benefit from flip chip configurations and top side cooling. For example, some embodiments of the present disclosure may be used in high power RF transistors for cellular or aerospace and defense (A&D) applications, such as 20 W or higher average output power RF transistors for 5G base station applications at 3.5 GHz and above. Embodiments of the present disclosure may also allow for lower cost products that are configured to operate at higher frequencies. While embodiments of the present disclosure have been described herein with reference to particular HEMT structures, the present disclosure should not be construed as limited to such structures, and may be applied to formation of many different transistor structures, such as pHEMTs (including GaAs/AlGaAs pHEMTs) and/or GaN MESFETs.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A semiconductor device package, comprising:
   an interconnect structure comprising a first surface having at least one die thereon and a second surface that is opposite the first surface and is configured to be coupled to an external device; and
   a protective structure on the first surface of the interconnect structure, wherein the protective structure exposes a heat dissipating surface, the heat dissipating surface comprises a surface of the at least one die, and the surface of the at least one die is adjacent a surface of the protective structure that is opposite the interconnect structure.

2. The semiconductor device package of claim 1, wherein the protective structure comprises at least one opening therein that exposes the heat dissipating surface.

3. The semiconductor device package of claim 2, wherein the protective structure comprises a mold structure.

4. The semiconductor device package of claim 1, further comprising:
   a thermally conductive member on the surface of the at least one die and on the surface of the protective structure opposite the interconnect structure.

5. The semiconductor device package of claim 4, wherein the thermally conductive member further comprises one or more support structures coupled to the interconnect structure.

6. The semiconductor device package of claim 1, wherein the at least one die comprises respective terminals facing the first surface of the interconnect structure and electrically connected to conductive patterns thereof in a flip chip configuration.

7. The semiconductor device package of claim 6, wherein the at least one die comprises one or more transistors having gate, source, or drain connections coupled to the respective terminals.

8. The semiconductor device package of claim 6, wherein the at least one die comprises one or more passive electrical components.

9. The semiconductor device package of claim 6, wherein the respective terminals comprise conductive bumps or conductive pillar structures.

10. The semiconductor device package of claim 1, wherein the second surface of the interconnect structure comprises input and output connections for the semiconductor device package.

11. The semiconductor device package of claim 1, wherein the protective structure comprises a lid member.

12. The semiconductor device package of claim 11, wherein the lid member comprises a material that is not electrically conductive.

13. The semiconductor device package of claim 1, wherein the heat dissipating surface is coupled or is configured to be coupled to an external cooling device.

14. The semiconductor device package of claim 1, wherein the surface of the at least one die is substantially coplanar with the surface of the protective structure opposite the interconnect structure.

15. The semiconductor device package of claim 1, wherein the at least one die comprises a plurality of dies having respective surfaces opposite the interconnect structure, and the heat dissipating surface comprises the respective surfaces of the plurality of dies.

16. The semiconductor device package of claim 15, wherein the respective surfaces of plurality of dies have respective heights that differ relative to the first surface of the interconnect structure.

17. The semiconductor device package of claim 15, wherein the respective surfaces of plurality of dies are substantially coplanar.

18. A semiconductor device package, comprising:
    an interconnect structure comprising conductive patterns therein and/or thereon, the interconnect structure comprising a first surface and a second surface that is opposite the first surface and is configured to be coupled to an external device;
    at least one die on the first surface of the interconnect structure, the at least one die comprising respective terminals facing the first surface and electrically connected to the conductive patterns in a flip chip configuration; and
    a heat dissipating surface on the at least one die and facing away from the interconnect structure in one or more directions, wherein the heat dissipating surface comprises a surface of the at least one die that is exposed opposite the interconnect structure.

19. The semiconductor device package of claim 18, further comprising:
    a thermally conductive member on the surface of the at least one die.

20. The semiconductor device package of claim 18, further comprising:
    a protective structure on the first surface of the interconnect structure, wherein the protective structure exposes the surface of the at least one die adjacent a surface of the protective structure that is opposite the interconnect structure.

21. The semiconductor device package of claim 20, wherein the protective structure comprises a mold structure having at least one opening therein that exposes the heat dissipating surface.

22. The semiconductor device package of claim 20, wherein the protective structure comprises a lid member on the at least one die, and the lid member comprises a material that is not electrically conductive.

23. The semiconductor device package of claim 18, wherein the heat dissipating surface is coupled or is configured to be coupled to an external cooling device.

24. A method of fabricating a semiconductor device package, the method comprising:
   providing an interconnect structure comprising a first surface having at least one die thereon and a second surface that is opposite the first surface and is configured to be coupled to an external device, wherein respective terminals of the at least one die are electrically connected to conductive patterns of the interconnect structure; and
   forming a protective structure on the first surface of the interconnect structure to provide a heat dissipating surface that is exposed thereby, wherein the heat dissipating surface comprises a surface of the at least one die, and the surface of the at least one die is adjacent a surface of the protective structure that is opposite the interconnect structure.

25. The method of claim 24, further comprising:
   mounting the second surface on the external device; and/or
   providing an external cooling device on the heat dissipating surface.

26. The method of claim 24, wherein the protective structure comprises a mold structure, and wherein forming the protective structure comprises:
   providing a film on the surface of the at least one die; and
   performing a film assisted molding process wherein the film covers the surface of the at least one die during formation of the mold structure.

27. The method of claim 24, wherein forming the protective structure comprises:
   forming portions of the protective structure on the surface of the at least one die; and
   performing a laser ablation process that removes the portions of the protective structure from the surface of the at least one die.

28. The method of claim 24, wherein forming the protective structure comprises:
   forming portions of the protective structure on the surface of the at least one die; and
   performing a mechanical grinding process that removes portions of the protective structure from the surface of the at least one die.

29. The method of claim 24, further comprising:
   attaching a thermally conductive panel to the surface of the at least one die and the surface of the protective structure, wherein the thermally conductive panel comprises a plurality of tie bar elements that connect portions thereof and are configured to be cut to singulate the interconnect structure having the at least one die thereon from the thermally conductive panel.

30. The method of claim 24, further comprising attaching a thermally conductive member to the surface of the at least one die and the surface of the protective structure opposite the interconnect structure.

31. The method of claim 24, wherein the protective structure comprises a lid member on the at least one die, and the lid member comprises a material that is not electrically conductive.

* * * * *